US010214015B2

(12) United States Patent
Tsukahara et al.

(10) Patent No.: US 10,214,015 B2
(45) Date of Patent: Feb. 26, 2019

(54) PIEZOELECTRIC DEVICE, INSPECTION METHOD FOR PIEZOELECTRIC DEVICE, AND LIQUID EJECTING HEAD

(71) Applicant: Seiko Epson Corporation, Tokyo (JP)

(72) Inventors: Katsutomo Tsukahara, Shiojiri (JP); Motoki Takabe, Shiojiri (JP); Eiju Hirai, Azumino (JP); Yoshihiro Hokari, Azumino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 15/910,535

(22) Filed: Mar. 2, 2018

(65) Prior Publication Data
US 2018/0186152 A1 Jul. 5, 2018

Related U.S. Application Data

(62) Division of application No. 15/409,774, filed on Jan. 19, 2017, now Pat. No. 9,937,717.

(30) Foreign Application Priority Data

Jan. 25, 2016 (JP) ................... 2016-011297

(51) Int. Cl.
B41J 2/045 (2006.01)
B41J 2/14 (2006.01)
(Continued)

(52) U.S. Cl.
CPC .......... B41J 2/14233 (2013.01); B41J 2/161 (2013.01); B41J 2/1623 (2013.01); B41J 2/1628 (2013.01);
(Continued)

(58) Field of Classification Search
USPC ............................. 347/50, 68, 70
See application file for complete search history.

(56) References Cited

U.S. PATENT DOCUMENTS 5,889,539 A 3/1999 Kamoi et al.
7,819,502 B2 10/2010 Enomoto et al.
(Continued)

FOREIGN PATENT DOCUMENTS

JP 2008-124343 A 5/2008
JP 2009-218567 A 9/2009
JP 2010-087102 A 4/2010

Primary Examiner — Lam Nguyen
(74) Attorney, Agent, or Firm — Harness, Dickey & Pierce, P.L.C.

(57) ABSTRACT

A piezoelectric device includes a substrate that includes a piezoelectric element formed by stacking a piezoelectric layer, a first electrode and a second electrode such that the piezoelectric layer is interposed between the first electrode and the second electrode; and a wiring substrate that includes a driving element providing a signal for driving the piezoelectric element to the substrate. The substrate has an inspection region where a piezoelectric element for inspection which is a portion of the piezoelectric element is disposed. The wiring substrate has an electrode inspection region including an electrode to be inspected that is electrically connected to the piezoelectric element for inspection and is disposed on a surface side opposite to the substrate, and a flexible substrate mounting region which is disposed on the surface side opposite to the substrate, and is connected to a flexible substrate. In plan view from a stacking direction of the substrate and the wiring substrate, the inspection region partially overlaps at least one of the inspection electrode region and the flexible substrate mounting region.

5 Claims, 12 Drawing Sheets

(51) Int. Cl.
*B41J 2/16* (2006.01)
*H01L 41/047* (2006.01)
*H01L 41/09* (2006.01)
*H01L 41/29* (2013.01)

(52) U.S. Cl.
CPC ........... *B41J 2/1629* (2013.01); *B41J 2/1632* (2013.01); *B41J 2/1634* (2013.01); *B41J 2/1643* (2013.01); *B41J 2/1646* (2013.01); *H01L 41/0475* (2013.01); *H01L 41/0973* (2013.01); *H01L 41/29* (2013.01); *B41J 2002/14419* (2013.01); *B41J 2002/14491* (2013.01); *B41J 2202/18* (2013.01)

(56) References Cited

U.S. PATENT DOCUMENTS

| | | |
|---|---|---|
| 8,616,683 B2 | 12/2013 | Hara |
| 2009/0213188 A1 | 8/2009 | Shimada et al. |
| 2011/0032310 A1 | 2/2011 | Owaki et al. |

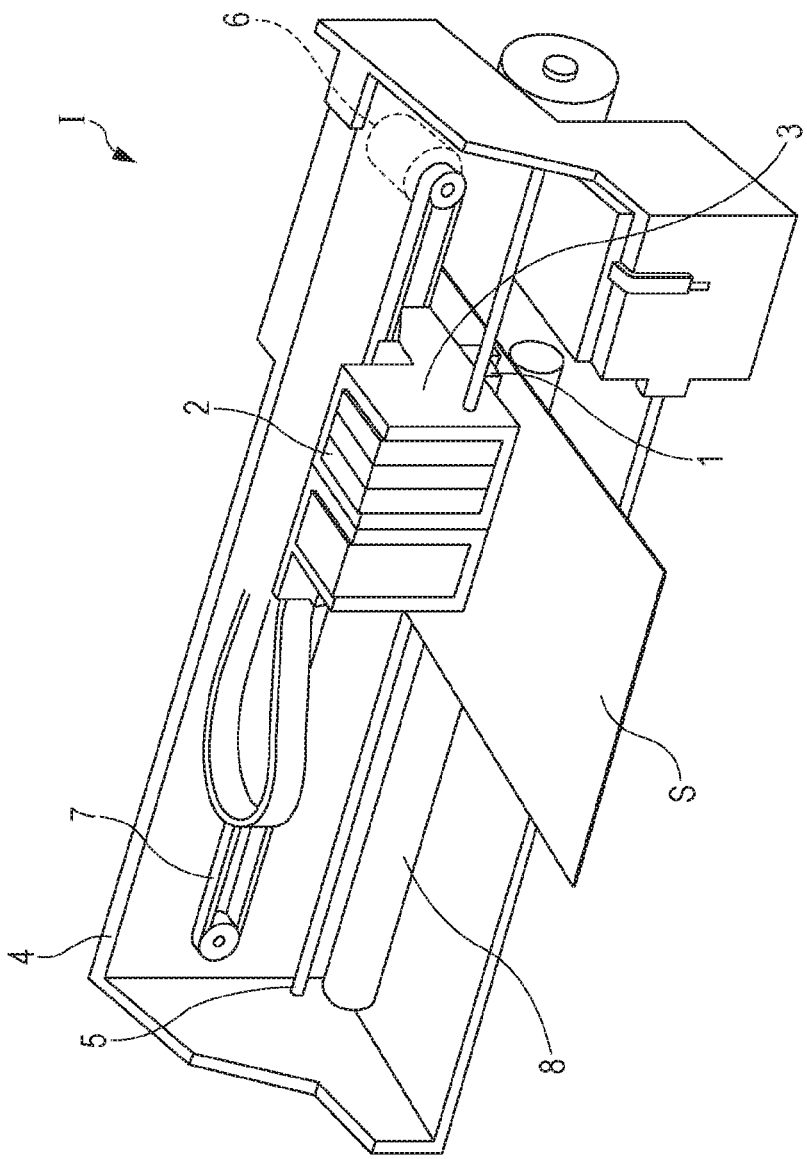

PIEZOELECTRIC DEVICE, INSPECTION METHOD FOR PIEZOELECTRIC DEVICE, AND LIQUID EJECTING HEAD

CROSS-REFERENCE TO RELATED APPLICATIONS

This is a divisional patent application of U.S. application Ser. No. 15/409,774, filed on Jan. 19, 2017, which claims priority to Japanese Patent Application No. 2016-011297, filed on Jan. 25, 2016, both applications of which are expressly incorporated by reference herein in their entireties.

BACKGROUND

1. Technical Field

The present invention relates to a piezoelectric device having a piezoelectric element on a substrate, an inspection method for a piezoelectric device, and a liquid ejecting head including a piezoelectric device.

2. Related Art

A piezoelectric element is formed by interposing a piezoelectric material having an electromechanical conversion function, for example, a piezoelectric layer formed of a crystallized dielectric material, between two electrodes. To measure displacement of this piezoelectric element, it has been suggested to perform an evaluation of the piezoelectric element by forming a test pattern on a substrate and measuring the displacement of the test pattern (for example, refer to JP-A-2010-87102). In addition, it has been suggested that by measuring the resistance of one of the electrodes of the piezoelectric element, as a test pattern, a thickness thereof can be measured (for example, refer to JP-A-2008-124343).

Here, in a piezoelectric element, although electrical characteristics affects characteristics of the piezoelectric element, the main factors for determining the electrical characteristics include the crystal structure, film thickness, film composition, and film density of the piezoelectric layer. Although these characteristics can be measured using mainly instrumental analysis in which optical inspection by X-ray is performed, as in JP-A-2010-87102 and JP-A-2008-124343, there is a problem in that the characteristics cannot be measured in a configuration in which an electrode is disposed in a portion to be measured.

Even though the piezoelectric layer is measured after forming the piezoelectric layer on one of the electrodes, when forming the other electrode on the piezoelectric layer after measuring, the piezoelectric layer sustains damage. Therefore, damage due to a post-processing of the piezoelectric layer is not reflected in the measurement result, and there is a variation in characteristics between the measurement result and the actual piezoelectric layer which becomes the piezoelectric element. Accordingly, there is a problem in that the piezoelectric layer cannot be evaluated with high precision.

Therefore, although it is conceivable to have an inspection region on a portion that is not a product region of the substrate on which the piezoelectric element is formed, if there is a distance between the product region and the inspection region, a difference between the piezoelectric layer of each product region and the measurement result of the inspection region occurs due to variations in manufacturing. Accordingly, there is a problem in that the actual piezoelectric layer of the product region cannot be evaluated with high precision.

Such problems are not limited to a piezoelectric device used in a liquid ejecting head or the like represented by an ink jet recording head and are similarly present in other piezoelectric devices.

SUMMARY

An advantage of some aspects of the invention is to provide a piezoelectric device that can measure the characteristics of the piezoelectric layer with high precision, an inspection method for a piezoelectric device, and a liquid ejecting head.

According to an aspect of the invention, there is provided a piezoelectric device including a substrate that includes a piezoelectric element formed by stacking a piezoelectric layer, a first electrode, and a second electrode such that the piezoelectric layer is interposed between the first electrode and the second electrode; and a wiring substrate that includes a driving element providing a signal for driving the piezoelectric element to the substrate. The substrate has, as a portion of the piezoelectric element, an inspection region on which is disposed a piezoelectric element that is to be inspected. The wiring substrate has an electrode inspection region including an electrode to be inspected that is electrically connected to the piezoelectric element to be inspected and is disposed on a surface side opposite to the substrate, and a flexible substrate mounting region on the surface side opposite to the substrate, and is connected to a flexible substrate. In plan view in a stacking direction of the substrate and the wiring substrate, the inspection region partially overlaps at least one of the inspection electrode region and the flexible substrate mounting region.

In the above aspect, the inspection region at least partially overlaps at least one of the inspection electrode region and the flexible substrate mounting region. Therefore, a new space for an inspection region is unnecessary, and there is no need to enlarge the substrate. By measuring the electrical characteristics of the piezoelectric layer in the inspection region, piezoelectric characteristics of the piezoelectric element can be evaluated with high precision. Furthermore, by having the inspection region on the substrate, the piezoelectric layer of the piezoelectric element and the piezoelectric layer of the inspection region can be disposed in close proximity to each other. Therefore, a variation which occurs between the characteristics of the piezoelectric layer measured in the inspection region and the characteristics of the piezoelectric layer of the piezoelectric element can be reduced. Furthermore, by having the inspection electrode region on a surface side opposite to the wiring substrate, the electrical characteristics of the piezoelectric element for inspection in the inspection region can be easily measured without having to disassemble the wiring substrate.

Here, it is preferable that the inspection electrode and the piezoelectric element for inspection be connected to each other via through wirings disposed in the wiring substrate. Accordingly, a space for routing the wiring is unnecessary, and the substrate can be further downsized.

It is preferable that the inspection electrode be extended to the flexible substrate mounting region and that the inspection electrode and the flexible substrate be connected to each other. Accordingly, the electrical characteristics of the inspection region can be easily measured via the flexible substrate.

Furthermore, according to another aspect of the invention, there is provided a liquid ejecting head including the piezoelectric device according to the above aspect.

In the above aspect, the liquid ejecting head in which the downsized piezoelectric layer is evaluated with high precision can be realized.

According to still another aspect of the invention, there is provided an inspection method for a piezoelectric device including a substrate that has a piezoelectric layer and a first electrode disposed by stacking the piezoelectric layer thereon, and a wiring substrate disposed by stacking the substrate thereon, the method including disposing the substrate and the wiring substrate in the order of the first electrode, the piezoelectric layer, and the wiring substrate, and optically inspecting the physical properties of the piezoelectric layer before a second electrode is formed on the wiring substrate side of the piezoelectric layer.

In the above aspect, by performing the optical inspection before the second electrode is formed on the piezoelectric layer, the physical properties can be evaluated with high precision in the optical inspection of the piezoelectric layer. By inspecting the physical properties of the piezoelectric layer disposed on the substrate, the variation that occurs between the characteristics of the piezoelectric layer measured in the inspection region and the characteristics of the piezoelectric layer of the piezoelectric element can be reduced.

Here, it is preferable to optically inspect physical properties of the piezoelectric layer on an inspection region where the second electrode of the piezoelectric layer be not formed, after the second electrode is formed on the wiring substrate side of the piezoelectric layer in the optical inspecting. Accordingly, even the physical properties of the piezoelectric layer are changed depending on forming the second electrode, the physical properties of the piezoelectric layer after the change can be measured by the optical inspecting. An error between the piezoelectric layer of the piezoelectric element to be actually used and the piezoelectric layer when being subjected to inspection can be reduced, and evaluation with high precision is possible.

It is preferable that a region on which light beams used in the optical inspecting are incident be an edge of the substrate in the optical inspecting. Accordingly, the physical properties of the piezoelectric layer on the edge can be inspected.

It is preferable to bond the wiring substrate to the substrate after the second electrode is formed on the region, to electrically connect the second electrode to the inspection electrode formed on the wiring substrate via through wirings formed on the wiring substrate, and to measure an electrical characteristics of a piezoelectric element formed on the region via the inspection electrode. Accordingly, by measuring the electrical characteristics of the piezoelectric element, the piezoelectric element can be evaluated with high precision. The space to route the wirings is unnecessary, and the substrate can be further downsized. Furthermore, even the inspection region is covered by the wiring substrate, the electrical characteristics of the piezoelectric element can be easily measured via the inspection electrode, without disassembling.

It is preferable that the inspection electrode be connected to a terminal to which the wiring substrate and a flexible substrate are connected, and that the electrical characteristics of the piezoelectric element formed on the region be measured via the flexible substrate. Accordingly, the electrical characteristics of the piezoelectric element can be easily measured via the flexible substrate, without disassembling.

BRIEF DESCRIPTION OF THE DRAWINGS

The invention will be described with reference to the accompanying drawings, wherein like numbers reference like elements.

FIG. 17 is a schematic view illustrating an ink jet recording apparatus according to one embodiment.

DESCRIPTION OF EXEMPLARY EMBODIMENTS

Hereinafter, the invention will be described in detail based on the embodiments of the invention.

First Embodiment

The invention will be described in detail based on a first embodiment of the invention. In the embodiment, an ink jet recording head that ejects ink as an example of a liquid ejecting head (hereinafter, simply refer to as a recording head) will be described.

Figure 1:
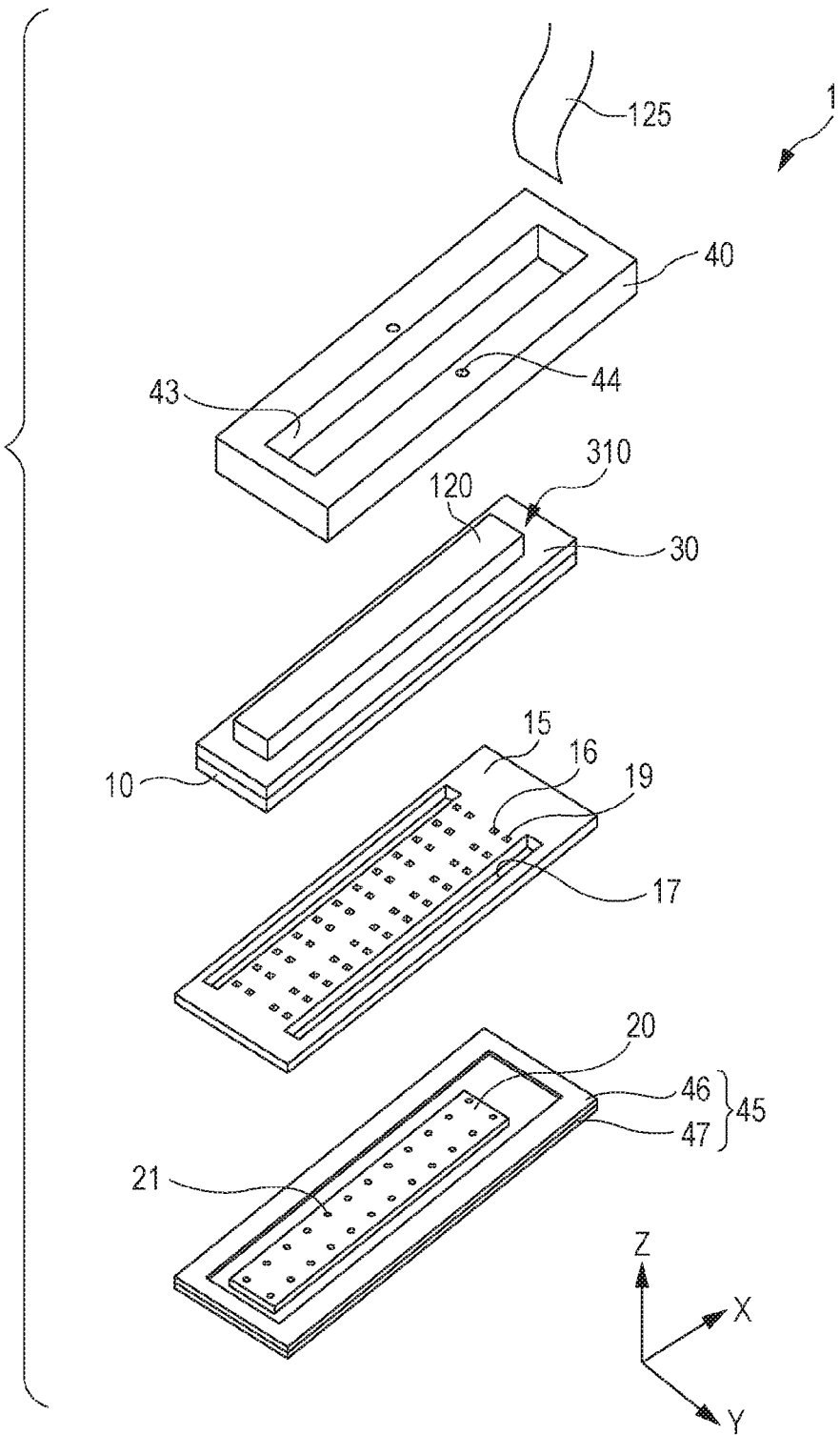
FIG. 1 is an exploded perspective view of a recording head according to a first embodiment.
Figure 2:
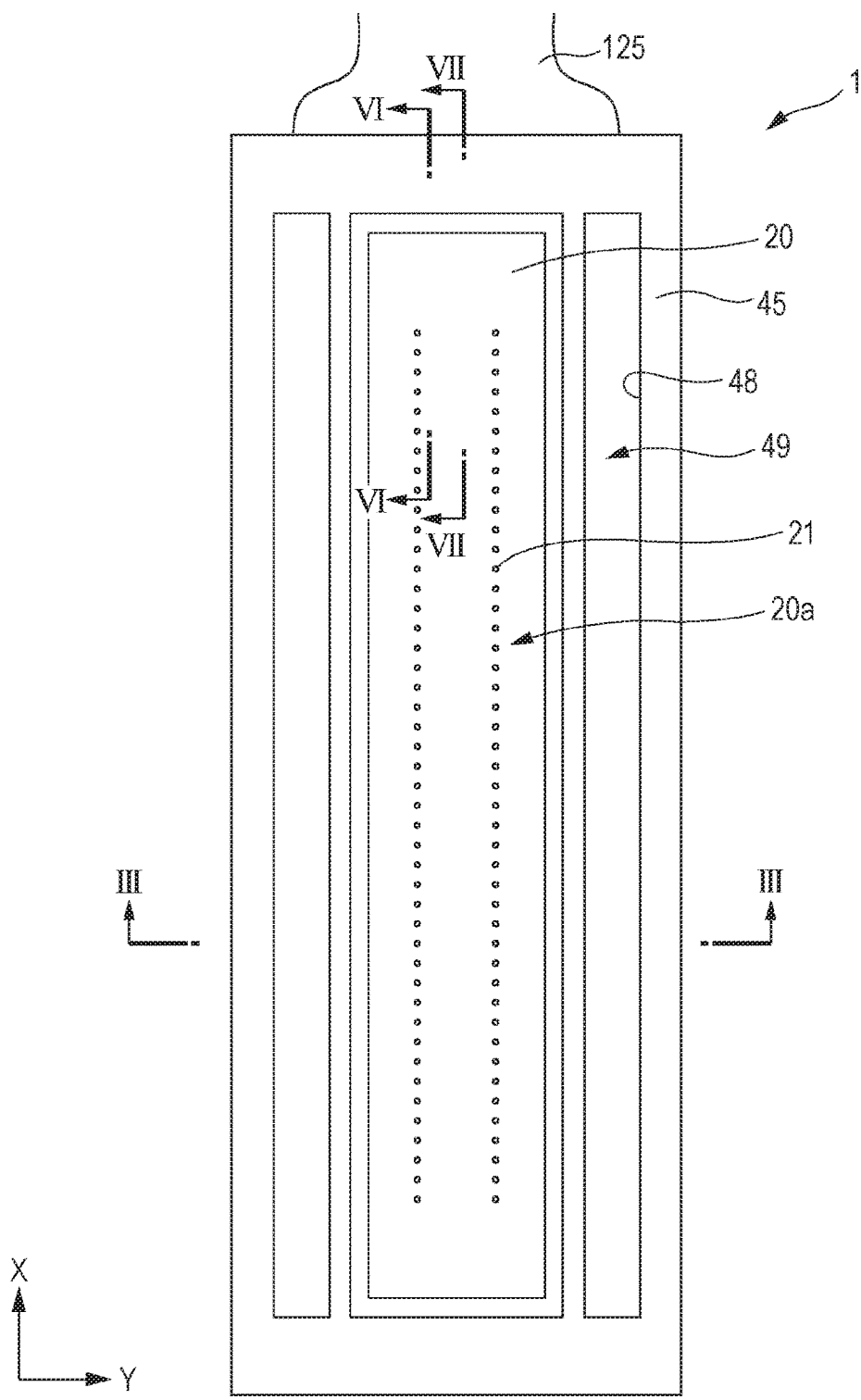
FIG. 2 is a plan view of the recording head according to the first embodiment.
Figure 3:
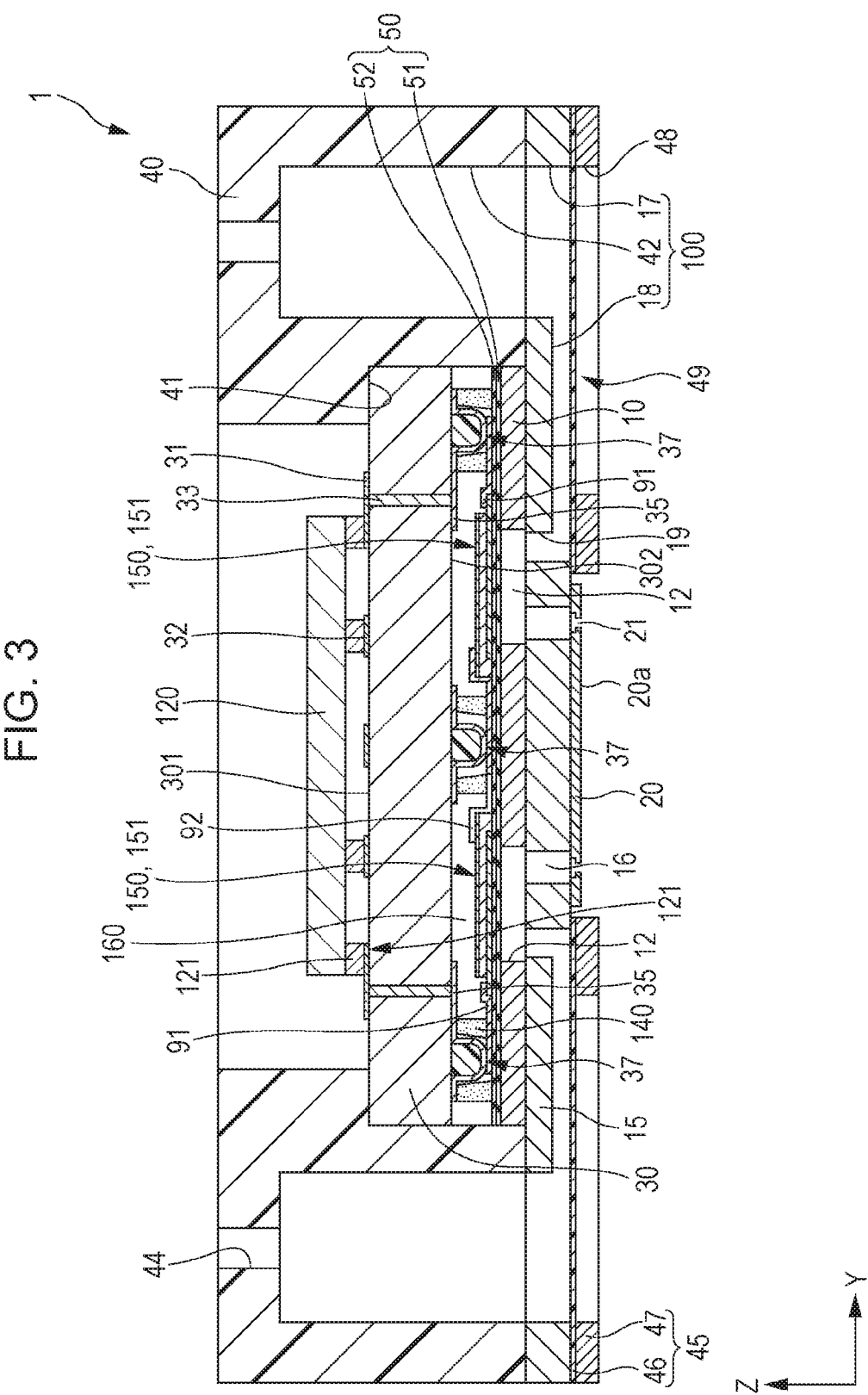
FIG. 3 is a cross-sectional view of the recording head according to the first embodiment.
Figure 4:
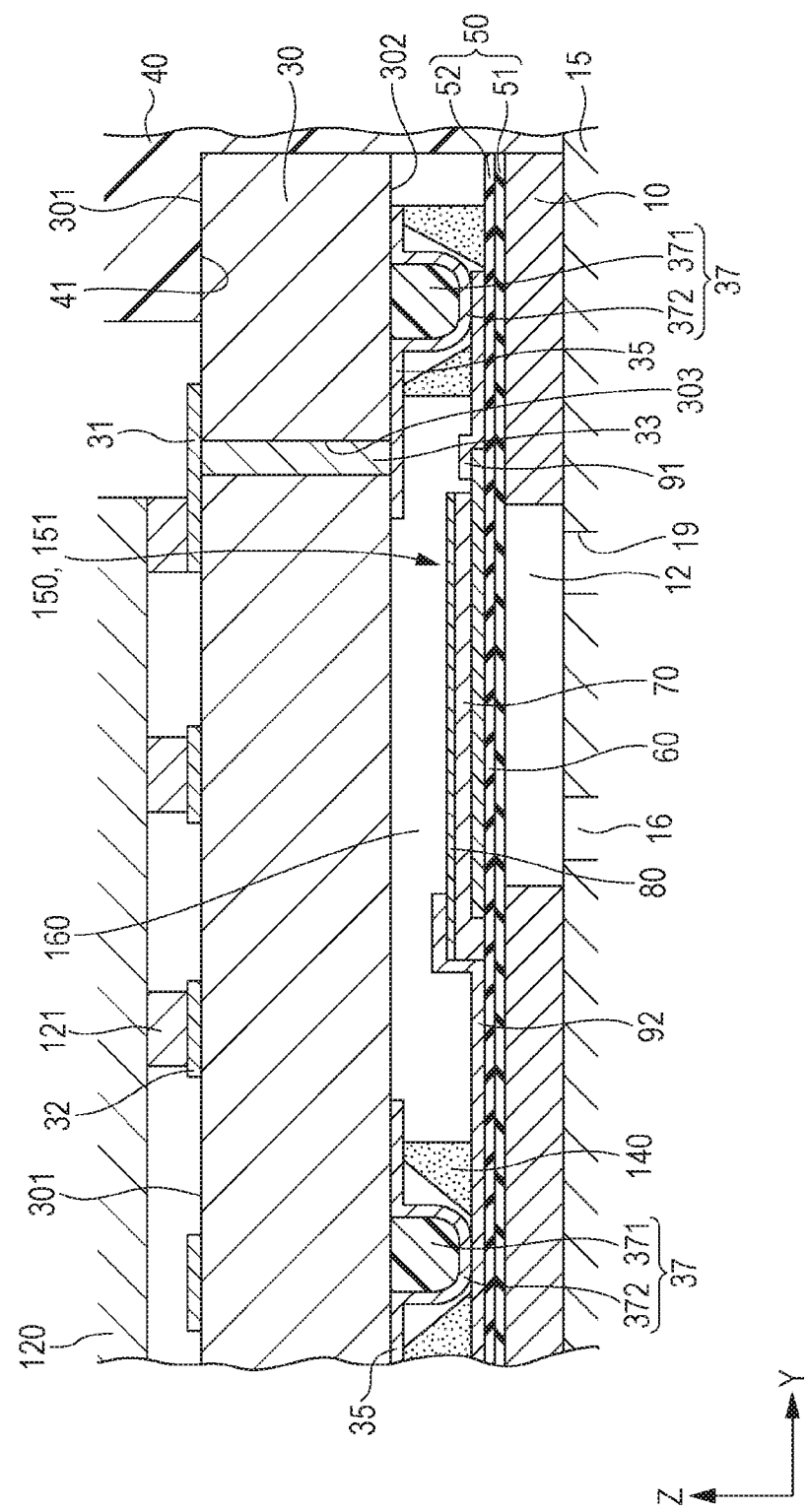
FIG. 4 is an enlarged cross-sectional view of a main portion of the recording head according to the first embodiment.
Figure 5:
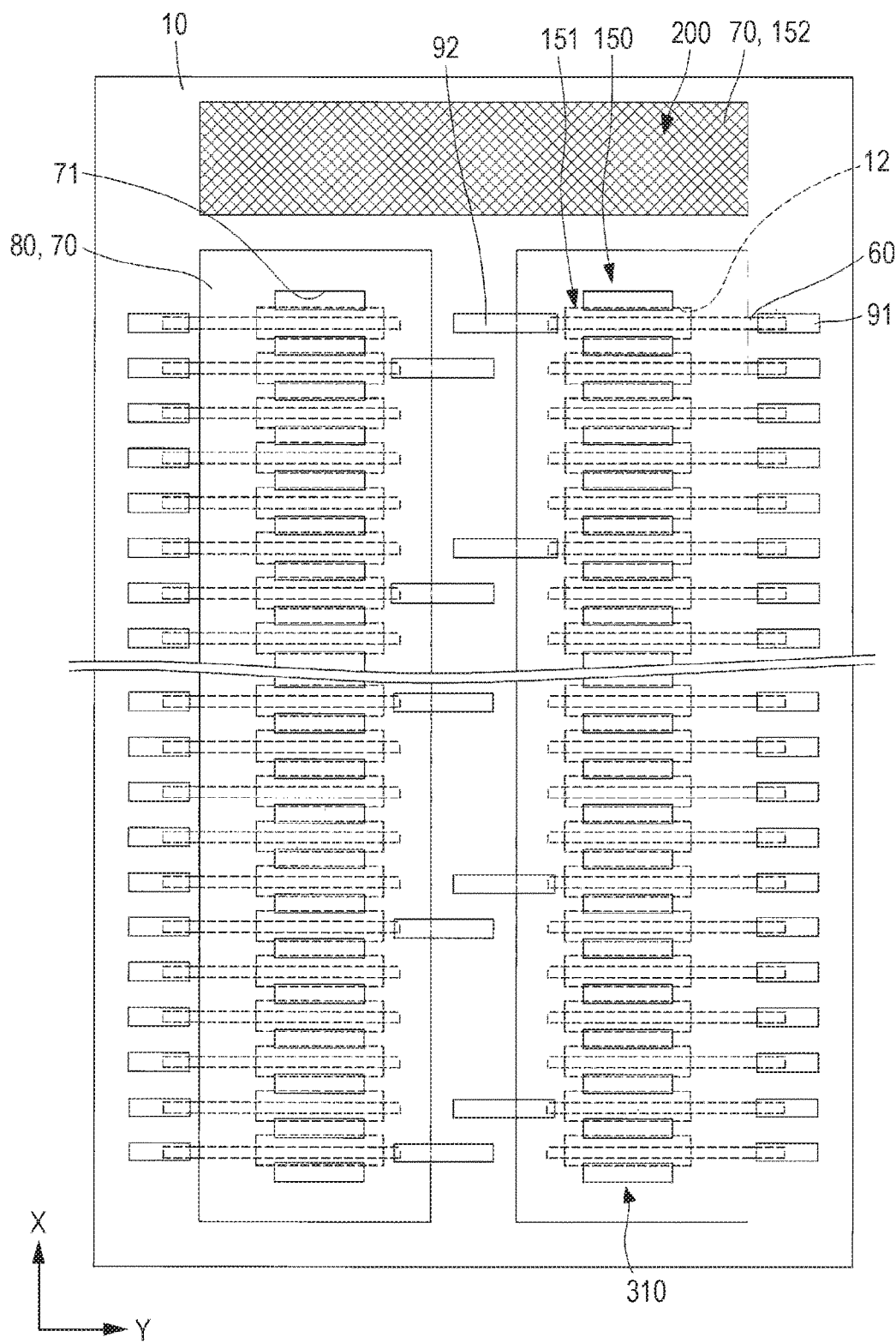
FIG. 5 is a plan view of a flow path forming substrate according to the first embodiment.
Figure 6:
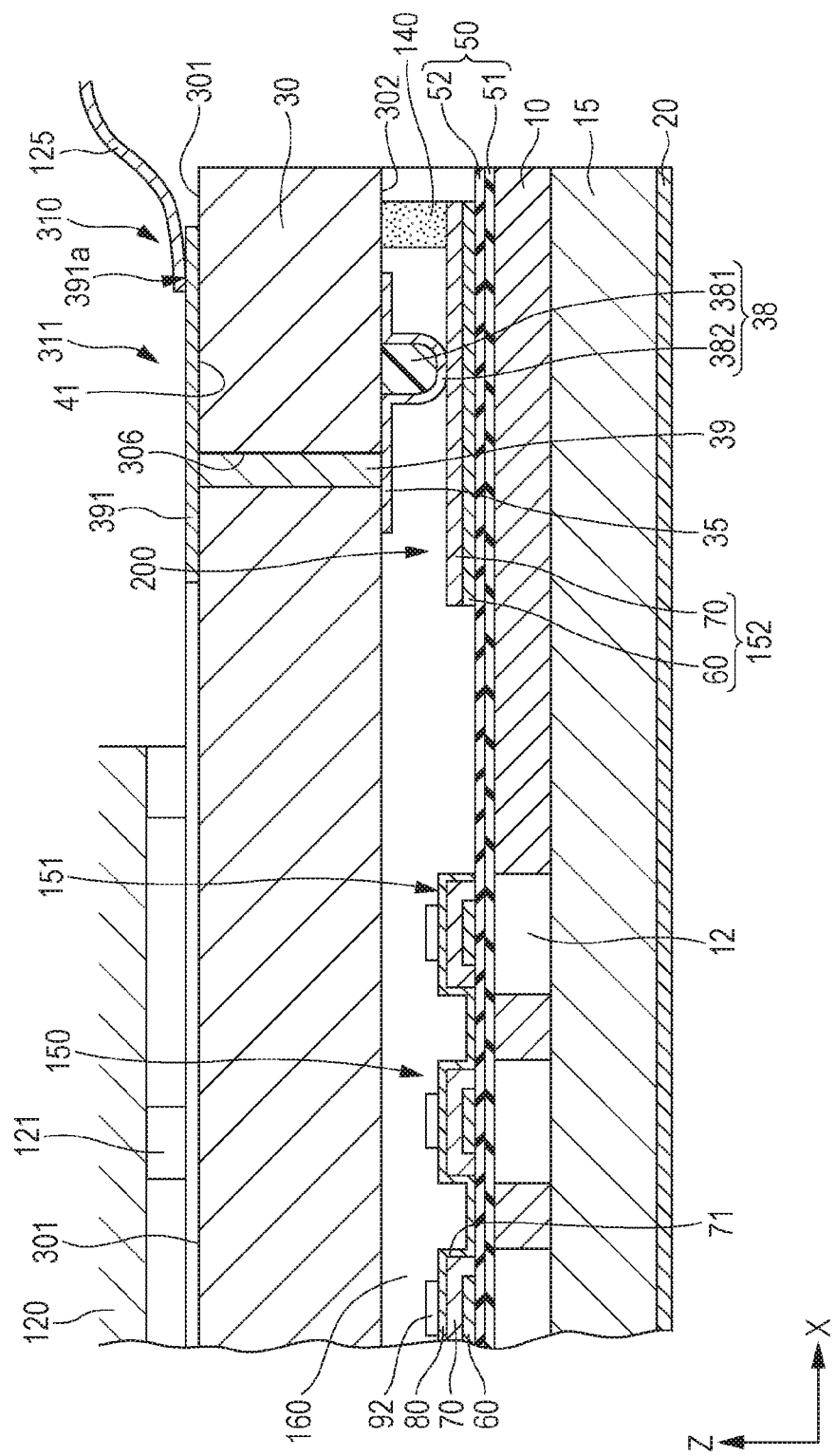
FIG. 6 is a cross-sectional view of the recording head according to the first embodiment.
Figure 7:
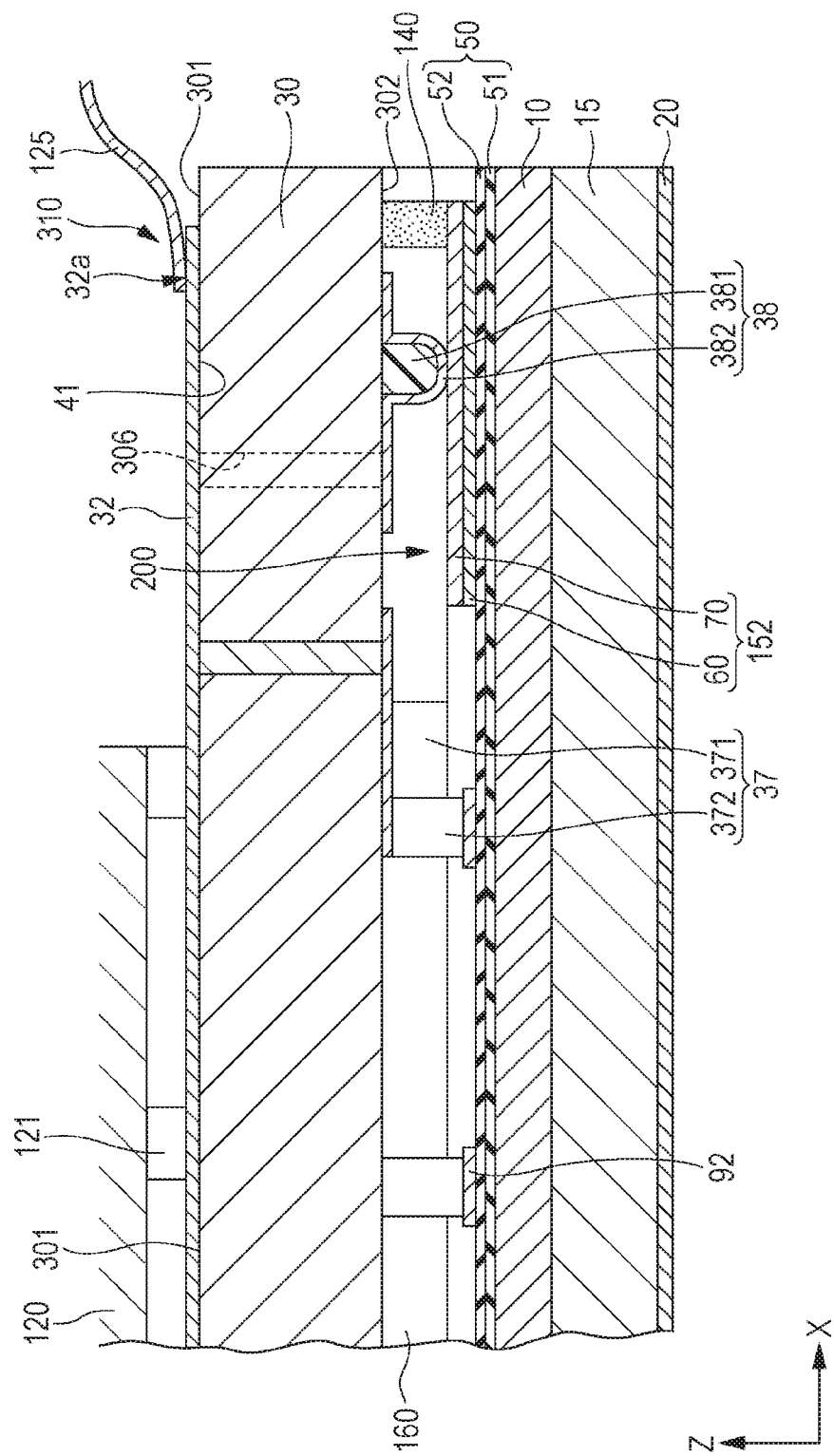
FIG. 7 is a cross-sectional view of the recording head according to the first embodiment.

FIG. 1 is an exploded perspective view of a recording head according to the embodiment, FIG. 2 is a plan view of the recording head (plan view of a liquid ejecting surface 20a side), FIG. 3 is a cross-sectional view taken along line III-III of FIG. 2, FIG. 4 is an enlarged cross-sectional view of a main portion of FIG. 3, FIG. 5 is a plan view of a flow path forming substrate, FIG. 6 is a cross-sectional view taken along line VI-VI of FIG. 2, and FIG. 7 is a cross-sectional view taken along line VII-VII of FIG. 2.

As illustrated, the recording head 1 of the embodiment is provided with a plurality of members, such as a flow path forming substrate 10 that is the substrate of the embodiment, a communicating plate 15, a nozzle plate 20, a driving circuit substrate 30 that is a wiring substrate of the embodiment, and a compliance substrate 45.

The flow path forming substrate 10 is a piezoelectric element substrate in which a piezoelectric element is disposed (details will be described later), and materials thereof that can be used include metals such as stainless steel and Ni, ceramic materials such as $ZrO_2$ or $Al_2O_3$, glass-ceramic materials, and oxides such as MgO and $LaAlO_3$. In the embodiment, the flow path forming substrate 10 is formed of a silicon single crystal substrate. In the flow path forming substrate 10, by performing anisotropic etching from one side, pressure chambers 12 that are partitioned by a plurality of partition walls are arranged in parallel in a direction where a plurality of nozzles 21 for ejecting ink are arranged in parallel. That is, the flow path forming substrate 10 corresponds to a pressure chamber substrate. A direction parallel to the pressure chamber 12 is referred to as the parallel direction of pressure chamber 12 or as a first direction X. Rows in which the pressure chambers 12 are arranged in the first direction X are disposed as a plurality of rows in the flow path forming substrate 10, and two rows are disposed in the embodiment. The direction in which rows of the pressure chamber 12 formed in the first direction X are disposed as a plurality of rows is hereinafter referred to as a second direction Y. Furthermore, a direction intersecting both of the first direction X and the second direction Y is referred to as a third direction Z in the embodiment. Coordinate axes illustrated in each drawing represent the first direction X, the second direction Y, and the third direction Z. The direction of an arrow is referred to as a positive (+) direction, and the direction opposite to the direction of the arrow is referred to as a negative (−) direction. Although the directions (X, Y, and Z) are orthogonal to each other in the embodiment, the arrangement of the directions in each configuration is not necessarily limited to an orthogonal arrangement.

In the flow path forming substrate 10, an opening area is narrower than the pressure chamber 12 on one edge side of the pressure chamber 12 in the second direction Y and a supply path for providing flow resistance of ink flowing into the pressure chamber 12 may be disposed.

In one side of the flow path forming substrate 10 (−Z direction on a side opposite to the driving circuit substrate 30), mainly as illustrated in FIG. 3, the communicating plate 15 and the nozzle plate 20 are sequentially stacked. That is, the communicating plate 15 disposed on one surface of the flow path forming substrate 10 and the nozzle plate 20 having the nozzle 21 disposed on a side opposite to the flow path forming substrate 10 of the communicating plate 15 are provided.

In the communicating plate 15, the pressure chamber 12 and a nozzle communicating path 16 communicating with the nozzle 21 are disposed. The communicating plate 15 has a larger area than the flow path forming substrate 10, and the nozzle plate 20 has a smaller area than the flow path forming substrate 10. Since the nozzle 21 of the nozzle plate 20 and the pressure chamber 12 are separated by disposing the communicating plate 15 in this manner, ink that is in the pressure chamber 12 is hardly affected by an increase in viscosity due to evaporation of water in the ink as a result of ink around the nozzle 21. Since the nozzle plate 20 is sufficient to cover only the opening of the nozzle communicating path 16 that enables the pressure chamber 12 and the nozzle 21 to communicate with each other, the area of the nozzle plate 20 can be relatively small, and it is possible to reduce costs. In the embodiment, a surface to which the nozzle 21 of the nozzle plate 20 is opened and onto which the ink droplets are ejected is referred to as a liquid ejecting surface 20a.

The communicating plate 15 is disposed with a first manifold portion 17 forming a portion of a manifold 100 and a second manifold portion 18.

The first manifold portion 17 is disposed to pass through the communicating plate 15 in a thickness direction (a stacking direction of the communicating plate 15 and the flow path forming substrate 10). The second manifold portion 18 does not pass through the communicating plate 15 in the thickness direction and is disposed to open to the nozzle plate 20 side of the communicating plate 15.

Furthermore, in the communicating plate 15, a supply communicating path 19 that communicates with one edge of the pressure chamber 12 in the second direction Y is independently disposed for each of the pressure chambers 12. The supply communicating path 19 communicates with the second manifold portion 18 and the pressure chamber 12.

Such a communicating plate 15 can consist of a metal such as stainless steel or Ni or a ceramic such as a zirconium-based ceramic. The communicating plate 15 is preferably made of a material having a linear expansion coefficient equivalent to that of the flow path forming substrate 10. That is, in a case in which a material having a linear expansion coefficient significantly different from that of the flow path forming substrate 10 is used as the communicating plate 15, heating and cooling may cause bending to occur due to a difference in the linear expansion coefficient between the flow path forming substrate 10 and that of the communicating plate 15. In the embodiment, by using the same material as the flow path forming substrate 10, that is, a silicon single crystal substrate as the communicating plate 15, the occurrence of bending or cracking due to heat, and the occurrence of peeling can be suppressed.

The nozzle 21 that communicates with each of the pressure chambers 12 via the nozzle communicating path 16 is formed in the nozzle plate 20. The nozzles 21 are arranged in parallel in the first direction X, and the rows of the nozzle 21 arranged in parallel in the first direction X form two rows in the second direction Y.

Such a nozzle plate 20 can use a metal such as stainless steel (SUS), an organic material such as polyimide resin, or the silicon single crystal substrate. By using the silicon single crystal substrate as the nozzle plate 20, the linear expansion coefficient of the nozzle plate 20 and the communicating plate 15 is equivalent. Therefore, the occurrence of bending or cracking due to heating or cooling, or the occurrence of peeling can be suppressed.

On the other hand, as illustrated in FIG. 4, a diaphragm 50 is formed on a side opposite to the communicating plate 15 of the flow path forming substrate 10 (+Z direction on the driving circuit substrate 30 sides). In the embodiment, an elastic film 51 formed of a silicon oxide disposed on the flow path forming substrate 10 side and an insulator film 52 formed of a zirconium oxide disposed on the elastic film 51 are disposed as the diaphragm 50. A liquid flow path of the pressure chamber 12 is formed by performing anisotropic etching on the flow path forming substrate 10 from one side (surface side to which the communicating plate 15 is bonded), and the other side of the liquid flow path of the pressure chamber 12 is defined by the elastic film 51. As a matter of course, the diaphragm 50, without being specifically limited thereto, may be disposed with any one of the elastic film 51 and the insulator film 52 and may be disposed with another film.

The piezoelectric element 150 is disposed to cause a pressure change in the ink in the pressure chamber 12 of the embodiment on the diaphragm 50 of the flow path forming substrate 10. As described above, in the flow path forming substrate 10, the pressure chambers 12 are arranged in parallel plural rows in the first direction X, and the rows of the pressure chamber 12 are arranged as two parallel rows in the second direction Y. The piezoelectric element 150 is formed of a row in which an active portion 151 that is a substantial driving unit is arranged in the first direction X, and rows of the active portion 151 of the piezoelectric element 150 are arranged as two parallel rows in the second direction Y.

The piezoelectric element 150 is formed by stacking a piezoelectric layer 70, a first electrode 60, and a second electrode 80 such that the piezoelectric layer is interposed between the first electrode 70 and the second electrode 80. The first electrode 60 is disposed on a side of the diaphragm 50 of the piezoelectric layer 70, and the second electrode 80 is disposed on a side opposite to the diaphragm 50. In the embodiment, the first electrode 60 forming the piezoelectric element 150 is separated for each of the pressure chambers 12 and forms the individual electrodes independently for each of the active portions 151 that are the substantial driving units of the piezoelectric element 150. A material of this first electrode 60, without being specifically limited as long as the material is a conductive material, for example, may preferably be a metal such as platinum (Pt) or iridium (Ir) or a conductive oxide such as $LaNiO_3$ or $SuRuO_3$.

The piezoelectric layer 70 is disposed continuously over the first direction X so that the second direction Y is a predetermined width. The edge of the piezoelectric layer 70 on one edge side of the pressure chamber 12 in the second direction Y (side opposite to the manifold 100) is positioned further toward an outer side than to the edge of the first electrode 60. That is, the edge of the first electrode 60 is covered by the piezoelectric layer 70. The edge of the piezoelectric layer 70 on the other side that is the manifold 100 side of the pressure chamber 12 in the second direction Y is positioned further toward an inner side than the edge of the first electrode 60 (pressure chamber 12 side), and the edge of the manifold 100 side of the first electrode 60 is not covered by the piezoelectric layer 70.

The piezoelectric layer 70 is formed of a piezoelectric material of the oxide having a polarization structure formed on the first electrode 60 and, for example, can be formed of a perovskite-type oxide represented by the general formula $ABO_3$. The perovskite-type oxide used in the piezoelectric layer 70, for example, can be a lead-based piezoelectric material containing lead or a lead-free piezoelectric material containing no lead.

As illustrated in FIGS. 5 and 6, recessed portions 71 are formed at positions corresponding to each of the partition walls between the pressure chambers 12 in the piezoelectric layer 70. By disposing the recessed portion 71 in the piezoelectric layer 70 in this manner, the piezoelectric element 150 can be satisfactorily displaced.

The second electrode 80 is disposed on the side opposite to the first electrode 60 of the piezoelectric layer 70 and forms common electrodes common to a plurality of the active portions 151. In the embodiment, as illustrated in FIG. 6, although the second electrode 80 is disposed in the recessed portion 71 of the piezoelectric layer 70, without being specifically limited thereto, the second electrode 80 may not be disposed in the recessed portion 71.

This piezoelectric element 150 having the first electrode 60, the piezoelectric layer 70, and the second electrode 80 is displaced by applying a voltage between the first electrode 60 and the second electrode 80. That is, by applying the voltage between both electrodes, a piezoelectric strain occurs in the piezoelectric layer 70 interposed between the first electrode 60 and the second electrode 80. When applying the voltage to both electrodes, a portion where the piezoelectric strain occurs in the piezoelectric layer 70 (region interposed between the first electrode 60 and the second electrode 80) is referred to as the active portion 151. On the contrary, a portion where no piezoelectric strain occurs in the piezoelectric layer 70 is referred to as the non-active portion. Incidentally, a variable portion facing the pressure chamber 12 of the piezoelectric element 150 is referred to as a flexible portion, and an outer portion of the pressure chamber 12 is referred to as a non-flexible portion.

As described above, the piezoelectric element 150 is the individual electrode by disposing independently the first electrode 60 for each of the plurality of the active portions 151, and is the common electrode by disposing continuously the second electrode 80 over the plurality of active portions 151. As a matter of course, without being limited to this aspect, the piezoelectric element 150 may be the common electrode by disposing continuously the first electrode 60 over the plurality of active portions 151, and may be the individual electrode by disposing independently the second electrode 80 for each of the active portions 151. As the diaphragm 50, without disposing the elastic film 51 and the insulator film 52, only the first electrode 60 may act as the diaphragm. The piezoelectric element 150 itself may substantially serve as the diaphragm. In the embodiment, the active portions 151 of the piezoelectric element 150 are arranged in parallel in the first direction X in response to the pressure chamber 12, the rows of the active portions 151 arranged in parallel in the first direction X are arranged in parallel two rows in the second direction Y in this manner.

An inspection region 200 where a piezoelectric element for inspection 152 is disposed is disposed in one edge side in the first direction X (+X side) that is the parallel direction of the active portion 151 of the piezoelectric element 150 of the flow path forming substrate 10. The piezoelectric element for inspection 152 is provided with the first electrode 60 disposed continuously from the piezoelectric element 150 having the plurality of the active portions 151, and the discontinuous piezoelectric layer 70 formed of the same layer as the piezoelectric layer 70 of the piezoelectric element 150. The second electrode 80 is not disposed on a front surface of the piezoelectric layer 70 in the piezoelectric element for inspection 152. That is, the piezoelectric element for inspection 152 has the first electrode 60 disposed via the diaphragm 50 and the piezoelectric layer 70 on the flow path forming substrate 10. In the embodiment, although the first electrode 60 configuring the piezoelectric element for inspection 152 is set to be continuous with the first electrode 60 configuring the piezoelectric element 150 having the active portion 151, without being specifically limited thereto, for example, the first electrode 60 of the piezoelectric element for inspection 152 and the first electrode 60 of the piezoelectric element 150 having the active portion 151 may be discontinuous. However, since when measuring an electrical characteristics of the piezoelectric layer 70 configuring the piezoelectric element for inspection 152, it is required to apply the voltage to the first electrode 60, even the first electrode 60 of the piezoelectric element 150 and the first electrode 60 of the piezoelectric element for inspection 152 are discontinuous, but are preferable to electrically connected to each other. The piezoelectric layer 70 of the piezoelectric element for inspection 152 and the piezoelectric layer 70 of the piezoelectric element 150 having the active portion 151 may be continuous. In the embodiment, a region of the flow path forming substrate 10 where one or a plurality of the piezoelectric elements for inspection 152 are disposed is referred to as the inspection region 200.

In the embodiment, one of the piezoelectric element for inspection 152 as the inspection region 200 is set to be disposed at +X side in the first direction X for each of the rows where the active portions 151 are arranged in parallel in the first direction X. As a matter of course, the number of the piezoelectric elements for inspection 152 is not specifically limited thereto, and two or more and the plurality of the piezoelectric elements for inspection 152 may be disposed for each of the rows of the active portions 151.

Although the details will be described later, the piezoelectric element for inspection 152 disposed on this inspection region 200 is electrically connected to an inspection electrode 391 disposed on a side opposite to the flow path forming substrate 10 of the driving circuit substrate 30, and can measure the electrical characteristics of the piezoelectric element for inspection 152 via the inspection electrode 391.

As illustrated in FIGS. 3 and 4, an individual lead electrode 91 that is lead-out wirings is led out from the first electrode 60 of the piezoelectric element 150. The individual lead electrode 91 is led out to outside of the row in the second direction Y from of the rows of the active portions 151.

Furthermore, a common lead electrode 92 that is the lead-out wiring is led out from the second electrode 80 of the piezoelectric element 150. In the embodiment, the common lead electrode 92 is electrically connected to each of the second electrodes 80 of the piezoelectric element 150 of two rows. The common lead electrode 92 is disposed at the rate of one for the plurality of active portions 151.

The driving circuit substrate 30 that is the wiring substrate of the embodiment is bonded to a surface of the piezoelectric element 150 side of the flow path forming substrate 10. The driving circuit substrate 30 has substantially the same size as the flow path forming substrate 10.

A material of the driving circuit substrate 30 is preferably a material of which the linear expansion coefficient is close that of the flow path forming substrate 10, and is formed of the same material as the flow path forming substrate 10, that is, the silicon single crystal substrate in the embodiment. The material of the driving circuit substrate 30 is set to be a material of which the linear expansion coefficient is substantially the same as that of the flow path forming substrate 10. Therefore, a curve or destruction due to a temperature change can be suppressed.

In the driving circuit substrate 30 of the embodiment, a surface on a side opposite to the flow path forming substrate 10 (+Z) is set to be a first main surface 301, and a surface at the flow path forming substrate 10 side (−Z) is referred to as a second main surface 302. On the first main surface 301 of the driving circuit substrate 30, a driving circuit 120 such as a driving IC (also referred to as a driver IC) that is a driving element which outputs a signal to drive the piezoelectric element 150 is mounted.

This driving circuit substrate 30 is disposed so that the first direction X that is the parallel direction of the active portion 151 of each of the rows of the piezoelectric elements 150 is be elongated. That is, the driving circuit substrate 30 is disposed so that the first direction X is a longitudinal direction, and the second direction Y is a short direction.

First individual wirings 31 and supply wirings 32 are disposed on the first main surface 301 of the driving circuit substrate 30.

The first individual wirings 31 are arranged in parallel plural rows in the first direction X on each of both edges in the second direction Y. The first individual wirings 31 extend along the second direction Y, and are electrically connected to each of the terminals 121 of the driving circuit 120 at one edge, and are electrically connected to first through wirings 33 passing through the driving circuit substrate 30 in the third direction Z that is the thickness direction at the other edge.

Here, the first through wirings 33 are disposed inside of a first through hole 303 disposed passing through the driving circuit substrate 30 in the third direction Z that is the thickness direction, and the wirings relaying between the first main surface 301 and the second main-surface 302. The first through hole 303 in which the first through wirings 33 are disposed can be formed by performing laser processing, drilling processing, dry etching processing (Bosch method, a non-Bosch method, and ion milling), wet etching processing, or sandblasting processing to the driving circuit substrate 30. The first through hole 303 is formed by filling with the first through wirings 33 in this first through hole 303. The first through wirings 33 are formed of a metal such as a copper (Cu), and can be formed by electrolytic plating, the electroless plating.

The first through wirings 33 are electrically connected to second individual wirings 35 on the second main-surface 302, and the second individual wirings 35 are respectively electrically connected to the individual lead electrode 91 connected to the first electrode 60 that is the individual electrode independently for each of the active portions 151 of the piezoelectric element 150. That is, the first individual wirings 31, the first through wirings 33, and the second individual wirings 35 are disposed the same number as the first electrode 60 of the piezoelectric element 150. The first individual wirings 31 and the second individual wirings 35, for example, can be formed by a sputtering method.

The supply wirings 32 are wirings to supply power of the driving circuit 120, a ground (GND), a driving signal (COM), a control signal of the driving circuit 120, and a bias voltage (vbs) applied to the second electrode 80 that is the common electrode of the piezoelectric element 150 from the substrate having a flexibility, so-called, a flexible substrate 125. Wirings formed in a strip shape towards the other edge from one edge in the first direction X that is the parallel direction of the active portion 151 of the piezoelectric element 150 is disposed plural in the second direction Y. Each of the supply wirings 32 may be formed in a linear shape along the first direction X, and may be disposed to be inclined to the first direction X. That is, a description that the supply wirings 32 are formed towards the other edge from one edge in the parallel direction of the active portion 151 of the piezoelectric element 150 means that a component (vector) directed in the first direction X is present in the extending direction of the supply wirings 32. However, since in the driving circuit 120, the terminal 121 thereof and the first individual wirings 31 are disposed to be connectable over the parallel direction of the active portion 151, the supply wirings 32 connected to the driving circuit 120 disposed in this manner are preferably disposed in the strip shape over the parallel direction of the active portion 151, as described above. Therefore, the length at a time of projecting the supply wirings 32 in the first direction X is preferably longer than the length at a time of projecting in the second direction Y. That is, a component directed in the first direction X is preferably greater than a component directed in the second direction Y in the supply wirings 32. Thereby, the supply wirings 32 connectable to the driving circuit 120 disposed over the parallel direction of the active portion 151 can be disposed in a space-saving manner. As a matter of course, the supply wirings 32 may be bent in the middle of extension. The supply wirings 32, for example, can be formed simultaneously with the first individual wirings 31. The first individual wirings 31 and the supply wirings 32 are formed simultaneously in this manner. Therefore, it is possible to reduce the cost by simplifying the manufacturing process.

The supply wirings 32 extended to a vicinity of one edge (+X side) of the driving circuit substrate 30 in the first direction X, and is electrically connected to the flexible substrate 125 such as an FPC at the extended edge. That is, one edge of the driving circuit substrate 30 of the supply wirings 32 is a flexible substrate mounting region 310 where electrode pads 32a to which the flexible substrate 125 is connected are disposed. That is, the flexible substrate mounting region 310 means a region where the electrode pads 32a to which the flexible substrate 125 of the driving circuit substrate 30 is connected are disposed. The flexible substrate 125, although not specifically illustrated, is connected to a control element such as a control circuit, as described above, and supply power from the control element, the ground (GND), the driving signal (COM), the control signal of the driving circuit 120, and the bias voltage (vbs) applied to the second electrode 80 that is the common electrode of the piezoelectric element 150 to the supply wirings 32. Incidentally, in the embodiment, the supply wirings 32 that supply the bias voltage to the second electrode 80 of the piezoelectric element 150 is not connected to the driving circuit 120, and are electrically connected to the second electrode 80 that is the common electrode of the piezoelectric element 150. The other supply wirings 32 are electrically connected to the driving circuit 120, and are used to supply power for a high-voltage circuit or a low-voltage circuit of the driving circuit 120, the ground (GND), the driving signal (COM), and the control signal of the driving circuit 120 to the driving circuit 120 from the flexible substrate 125.

The supply wirings 32 that supply the bias voltage, as illustrated in FIG. 7, is electrically connected to second through wirings 34 disposed in the driving circuit substrate 30.

The second through wirings 34 are formed in a second through hole 305 disposed passing through in the third direction Z. The supply wirings 32 cover an end surface of the first main surface 301 side of the second through wirings 34. Therefore, both are electrically connected to each other. The second through wirings 34 can be formed by electrolytic plating or the electroless plating of the metal such as the copper (Cu), similar to the first through wirings 33 described above. The first through wirings 33 and the second through wirings 34 are formed simultaneously. Therefore, it is possible to reduce the cost by simplifying the manufacturing process.

The driving circuit 120 is mounted in the first individual wirings 31 and the supply wirings 32 disposed on the first main surface 301 of the driving circuit substrate 30 in this manner. That is, the terminal 121 of the driving circuit 120 is electrically connected to the first individual wirings 31 and the supply wirings 32. The flexible substrate mounting region 310 in which the electrode pads 32a connected to the flexible substrate 125 are disposed is disposed outside (+X side) in the first direction X of the region where the driving circuit 120, the first individual wirings 31 that are wirings connected to the piezoelectric element 150 from the driving circuit 120, or the supply wirings 32 are formed.

On the other hand, as illustrated in FIGS. 3, 4, and 7, the second individual wirings 35 connected to the first through wirings 33 and connection wirings 36 connected to the second through wirings 34 are disposed on the second main surface 302 of the driving circuit substrate 30.

The second individual wirings 35 and the connection wirings 36 are respectively electrically connected to the individual lead electrode 91 and the common lead electrode 92 by a bump electrode 37.

Here, the bump electrode 37, for example, has a core portion 371 formed of a resin material having elasticity and bump wirings 372 that at least partially covers a front surface of the core portion 371.

The core portion 371 is formed of a photosensitive insulating resin or a thermosetting insulating resin, such as a polyimide resin, an acrylic resin, a phenol resin, a silicone resin, a silicone-modified polyimide resin, or an epoxy resin.

The core portion 371 is substantially formed in a semi-cylindrical shape before connecting the driving circuit substrate 30 and the flow path forming substrate 10. Here, the semi-cylindrical shape means that an inner surface (bottom surface) in contact with the driving circuit substrate 30 is a plane, and means a columnar shape in which an outer surface which is a non-contact surface is a curved surface. Specifically, the substantially semi-cylindrical shape includes that a cross section is a substantially semicircular shape, a substantially semielliptical shape, and a substantially trapezoidal shape.

The driving circuit substrate 30 and the flow path forming substrate 10 are pressed so as to relatively close. Therefore, a tip shape of the core portion 371 is elastically deformed so as to follow a front surface shape of the individual lead electrodes 91 and the common lead electrode 92. Thereby, even if the curve or undulation is on the driving circuit substrate 30 or the flow path forming substrate 10, the core portion 371 is deformed following the curve or the undulation. Therefore, the bump electrode 37 can be securely connected to the individual lead electrode 91 and the common lead electrode 92.

The core portions 371 are formed continuously in a linear shape along the first direction X. The core portions 371, as illustrated in FIG. 3, are arranged in parallel plural in the second direction Y. In the embodiment, the core portions 371 are disposed with total of three, that is, total of two is one for each of the outer two rows of the active portion 151 of the piezoelectric element 150, and one between two rows of the active portion 151 of the piezoelectric element 150 in the second direction Y. Each of the core portions 371 disposed in the outer two rows of the active portion 151 of the piezoelectric element 150 is formed of the bump electrode 37 to connect the second individual wirings 35 to the individual lead electrode 91. The core portion 371 disposed between two rows of the active portion 151 of the piezoelectric element 150 is formed of the bump electrode 37 to connect the connection wirings 36 and two rows of the common lead electrode 92 of the piezoelectric element 150. This core portion 371 can be formed by a photolithography technique or an etching technique.

The bump wirings 372 cover at least a portion of the front surface of the core portion 371. These bump wirings 372, for example, are formed by a metal, such as Au, TiW, Cu, Cr (chromium), Ni, Ti, W, NiV, Al, Pd (palladium), or a lead-free solder or an alloy, may be these single layer, or may be formed by stacking a plurality of types. The bump wirings 372 are deformed along a front surface shape of the first individual wirings 31 and the supply wirings 32 by an elastic deformation of the core portion 371, and respectively electrically bonded to the individual lead electrode 91 and the common lead electrode 92. In the embodiment, an adhesive layer 140 is disposed between the driving circuit substrate 30 and the flow path forming substrate 10, and the driving circuit substrate 30 and the flow path forming substrate 10 are bonded to each other by the adhesive layer 140, so that a connection state is maintained between the bump electrode 37, and the individual lead electrode 91 and the common lead electrode 92.

In the embodiment, the bump wirings 372 configuring the bump electrode 37 to connect the second individual wirings 35 to the individual lead electrode 91 is configured by extending the second individual wirings 35 to upper side of the core portion 371. Similarly, the bump wirings 372 configuring the bump electrode 37 to connect the connection wirings 36 to the common lead electrode 92 is configured by extending the connection wirings 36 to upper side of the core portion 371. As a matter of course, using the second individual wirings 35 and the connection wirings 36, and each of the bump wirings 372 as separate wirings, these wirings may be electrically connected by stacking a portion of both wirings.

Here, as illustrated in FIG. 7, the connection wirings 36 extend to upper side of the core portion 371 in a plurality of locations at predetermined intervals along the first direction X. That is, a plurality of the bump electrodes 37 connecting the connection wirings 36 and the common lead electrode 92 are disposed at predetermined intervals over the first direction X. These connection wirings 36 are electrically connected to one of the supply wirings 32 of the first main surface 301 via the second through wirings 34. Therefore, the electrical resistance of the supply wirings 32 to which the connection wirings 36 are connected can be substantially reduced. That is, by connecting to the wirings having less current capacity, the connection wirings 36 can reduce the electrical resistance of the wirings. The connection wirings 36 are electrically connected to one of the supply wirings 32 via a plurality of the second through wirings 34 disposed at predetermined intervals in the first direction X. Therefore, it is possible to suppress voltage drop in the first direction X of the supply wirings 32 and the connection wirings 36. Since the connection wirings 36 are electrically connected to the common lead electrode 92 at a plurality of locations in the second direction Y via the bump electrode 37, the voltage drop in the first direction X of the second electrode 80 is suppressed, and applied variations of the bias voltage to each of the active portions 151 is suppressed. Therefore, it is possible to suppress displacement characteristics variations of each of the active portions 151.

An electrical connection between the second individual wirings 35 and the connection wirings 36, and the individual lead electrode 91 and the common lead electrode 92 is not limited to the bump electrode 37 described above, and for example, may be a metal bump formed of gold (Au). The connection between the second individual wirings 35 and the connection wirings 36, and the individual lead electrode 91 and the common lead electrode 92 may be connected by crimping with intervening welding of a solder connection, an anisotropic conductive adhesive (ACP and ACF), or a nonconductive adhesive (NCP and NCF). Furthermore, the connection between the terminal 121 of the driving circuit 120 described above, and the first individual wirings 31 and the supply wirings 32 may be similarly connected by using the bump electrode having the core portion and the bump wirings similar to the bump electrode 37 described above, and may be the metal bump. The connection between the terminal 121 of the driving circuit 120, and the first individual wirings 31 and the supply wirings 32 may be connected by crimping with intervening the welding of the solder connection, the anisotropic conductive adhesive (ACP and ACF), or the nonconductive adhesive (NCP and NCF).

By connecting the second individual wirings 35 to the individual lead electrode 91 in this manner, the terminals 121 of the driving circuit 120 are electrically connected to the first electrodes 60 of each of the active portions 151 via the first individual wirings 31, the first through wirings 33, the second individual wirings 35 and the individual lead electrode 91, and the driving signals from the driving circuit 120 are supplied each of the active portions 151. By connecting the connection wirings 36 to the common lead electrode 92, the bias voltage from the flexible substrate 125 is supplied to the second electrode 80 of the piezoelectric element 150.

At the first main surface 301 side that is a surface opposite to the flow path forming substrate 10 of the driving circuit substrate 30, there is an inspection electrode region 311 where the inspection electrode 391 electrically connected to the piezoelectric element for inspection 152 is disposed. Here, a description that the inspection electrode 391 is electrically connected to the piezoelectric element for inspection 152 means that the electrode is connected so that the electrical characteristics of the piezoelectric layer 70 of the piezoelectric element for inspection 152 can be measured via the inspection electrode 391. In the embodiment, as illustrated in FIG. 6, the bump electrode 38 is disposed on the second main surface 302 of the driving circuit substrate 30, and the bump electrode 38 is abutted on the front surface of the piezoelectric layer 70 of the piezoelectric element for inspection 152. The bump electrode 38 disposed on the second main surface 302 and the inspection electrode 391 disposed on the first main surface 301 are set to be electrically connected to each other via a third through wirings 39 passing through the driving circuit substrate 30 in the third direction Z.

Here, the bump electrode 38 has the same configuration as the bump electrode 37 described above. That is, the bump electrode 38 has the core portion 381 formed of the resin material having the elasticity, and the bump wirings 382 that at least partially covers a front surface of the core portion 381.

A cross section of the core portion 381 is formed in the substantially semi-cylindrical shape, and the core portion 381 extends along the second direction Y in the embodiment.

The bump wirings 382 is led out to the active portion 151 side from the front surface of the core portion 381 in the first direction X.

The bump electrode 38 having this core portion 381 and the bump wirings 382 can be formed simultaneously with the bump electrode 37 having the core portion 371 and the bump wirings 372. Thereby, it is possible to reduce the cost by simplifying the manufacturing process.

The third through wirings 39 for electrically connecting the bump electrode 38 and the inspection electrode 391 are disposed inside a third through hole 306 which passes through the driving circuit substrate 30 in the third direction Z. The third through hole 306 and the third through wirings 39 can be formed simultaneously with the first through hole 303 and the second through hole 305, and the first through wirings 33 and the second through wirings 34 described above.

A portion in which the inspection electrode 391 electrically connected via the bump electrode 38 and the third through wirings 39 on the first main surface 301 of the driving circuit substrate 30 is disposed is the inspection electrode region 311. In the embodiment, since the piezoelectric elements for inspection 152 are respectively disposed at each rows of each of the active portions 151, the inspection electrodes 391 are independently disposed for each of the piezoelectric elements for inspection 152. That is, two inspection electrodes 391 are disposed on the first main surface 301 of the driving circuit substrate 30 of the embodiment. A portion of the first main surface 301 of the driving circuit substrate 30 in which two inspection electrodes 391 are disposed is referred to as the inspection electrode region 311.

In the embodiment, the inspection electrode 391 extend to one edge of the first direction X (+X direction) of the driving circuit substrate 30, and is connected to the flexible substrate 125 at the extended edge. That is, the edge at +X side of the inspection electrode 391 extends to the flexible substrate mounting region to which the flexible substrate 125 is connected, and is electrically connected to the flexible substrate 125 at the extended edge 391a.

Thus, the bump electrode 38 is abutted on the piezoelectric layer 70 of the piezoelectric element for inspection 152 disposed in the inspection region 200. The bump electrode 38 is led out on the first main surface 301 by the third through wirings 39 and is electrically connected to the inspection electrode 391. Therefore, the electrical characteristics of the piezoelectric layer 70 of the piezoelectric element for inspection 152 can be easily measured via the inspection electrode 391. That is, without releasing, that is, disassembling, the bonding between the driving circuit substrate 30 and the flow path forming substrate 10, the electrical characteristics of the piezoelectric element for inspection 152 can be easily measured via the inspection electrode 391. As a measurement of the electrical characteristics of the piezoelectric layer 70 of the piezoelectric element for inspection 152, hysteresis characteristics, current—voltage characteristics (I-V characteristic), current—time characteristic (I-t characteristics) and capacity—voltage characteristics (C-V characteristic) are included.

In the embodiment, by connecting the inspection electrode 391 to the flexible substrate 125, the electrical characteristics of the piezoelectric element for inspection 152 can be easily measured via the control element (not illustrated) connected via the flexible substrate 125. That is, to measure the electrical characteristics of the piezoelectric layer 70 of the piezoelectric element for inspection 152, it is not required to disassemble the recording head 1, an unitized head unit having the recording head 1, or the recording device in which the recording head 1 or the head unit is held. The measurement of the electrical characteristics of the piezoelectric layer 70 of the piezoelectric element for inspection 152 can be easily performed at a desired timing, without disassembling. Accordingly, the piezoelectric element 150 can be evaluated with high precision, and it is possible to perform the driving suitable for the electrical characteristics of the piezoelectric element 150. In the embodiment, although the inspection electrode 391 and the flexible substrate 125 are electrically connected, without being specifically limited thereto, for example, the flexible substrate that is different from the flexible substrate 125 that supplies the power or the driving signal to the driving circuit 120 may be connected to the inspection electrode 391. However, as the embodiment, the supply wirings 32 and the inspection electrode 391 are connected to one piece of the flexible substrate 125. Therefore, it is possible to reduce the cost by reducing the number of parts. In the embodiment, although the inspection electrode 391 is connected to the flexible substrate 125, without being specifically limited thereto, the inspection electrode 391 may not be connected to the flexible substrate 125. That is, by abutting a probe for measurement on the inspection electrode 391, the electrical characteristics of the piezoelectric layer 70 of the piezoelectric element for inspection 152 may be measured.

At least one of the inspection electrode region 311 in which the inspection electrode 391 of this driving circuit substrate 30 is disposed and the flexible substrate mounting region 310, and the inspection region 200 in which the piezoelectric element for inspection 152 of the flow path forming substrate 10 is disposed at least partially overlap each other and disposed, when plan viewed from the third direction Z that is the stacking direction between the driving circuit substrate 30 and the flow path forming substrate 10. In the embodiment, the inspection region 200, and both of the inspection electrode region 311 and the flexible substrate mounting region 310 at least partially overlap each other and disposed, when plan viewed from the third direction Z. This is because, as described above, the inspection electrode 391 in the embodiment extends to the flexible substrate mounting region 310. A description that the inspection region 200, and at least one of the inspection electrode region 311 and the flexible substrate mounting region 310 are disposed at a at least partially overlapping position includes that any one of the inspection region 200 and at least one of the inspection electrode region 311 and the flexible substrate mounting region 310 overlap so as to be completely included in the other region, and includes that both of the regions partially overlap each other. Incidentally, in a case where the inspection electrode 391 is not extended to the flexible substrate mounting region 310, without overlapping the inspection region 200 and the flexible substrate mounting region 310, the inspection region 200 and the inspection electrode region 311 may at least partially overlap each other. In a case where the inspection electrode 391 is not extended to the flexible substrate mounting region 310, without overlapping the inspection region 200 and the inspection electrode region 311, the inspection region 200 and the flexible substrate mounting region 310 may at least partially overlap each other. As a matter of course, even in a case where the inspection electrode 391 is not extended to the flexible substrate mounting region 310, at least a portion of the inspection region 200, and both of the inspection electrode region 311 and the flexible substrate mounting region 310 may overlap each other.

Thus, at least one of the inspection electrode region 311 in which the inspection electrode 391 of this driving circuit substrate 30 is disposed and the flexible substrate mounting region 310, and the inspection region 200 in which the piezoelectric element for inspection 152 of the flow path forming substrate 10 is disposed at least partially overlap each other and disposed, when plan viewed from the third direction Z. Therefore, the flow path forming substrate 10 can be downsized, and the recording head 1 can be downsized. That is, in the driving circuit substrate 30 and the flow path forming substrate 10 in the embodiment, the flexible substrate mounting region 310 to connect the flexible substrate 125 is disposed at one edge side (+X side) of the first direction X, to a region where rows of the active portions 151 are formed. The flexible substrate mounting region 310 is a region required for the first main surface 301 side of the driving circuit substrate 30, and a space between the driving circuit substrate 30 and the flow path forming substrate 10 is a dead space in the flexible substrate mounting region 310. Therefore, the piezoelectric element for inspection 152 for measuring the electrical characteristics of the piezoelectric layer 70 is disposed in the dead space in the embodiment. Accordingly, it is not required to newly dispose the inspection region 200 disposing the piezoelectric element for inspection 152 on the flow path forming substrate 10, and the flow path forming substrate 10 can be downsized. The flexible substrate mounting region 310 is disposed outside (+X side) in the first direction X of the region where the driving circuit 120, the first individual wirings 31 that is the wirings extending to the piezoelectric element 150 from the driving circuit 120, or the supply wirings 32. Therefore, when plan viewed from the third direction Z, at least a portion of the inspection region 200 in which the piezoelectric element for inspection 152 is disposed is disposed so as to overlap at least one of the inspection electrode region 311 and the flexible substrate mounting region 310. Accordingly, without affecting optimal wirings connected to the piezoelectric element 150 from the driving circuit 120, the inspection region 200 can be disposed. That is, by disposing the inspection region 200, there is no possibility to change a layout of the optimal wirings to the piezoelectric element 150 from the driving circuit 120. Therefore, enlargement of the flow path forming substrate 10 and the driving circuit substrate 30 due to change of the wirings layout or increase of the wirings resistance can be suppressed. The recording head 1 is downsized, and the piezoelectric elements for inspection 152 are disposed in each of the recording heads 1 as described above. Therefore, the electrical characteristics of the piezoelectric layer 70 for each the recording head 1 can be measured and inspected, and quality control of the recording head 1 can be performed with high precision.

In the embodiment, even the flexible substrate mounting region 310 and the inspection region 200 are disposed at the overlapping position, the bump electrode 38 abutting on the piezoelectric element for inspection 152 of the inspection region 200 and the inspection electrode 391 can be electrically connected to each other by the third through wirings 39. Accordingly, a space to install the wirings that connects the bump electrode 38 of the first main surface 301 and the inspection electrode 391 of the second main surface 302 is unnecessary, and it is possible to further downsize.

This flow path forming substrate 10 and the driving circuit substrate 30 are bonded to each other in a state in which a holding portion 160 which is a space in which the piezoelectric element 150 is disposed between the flow path forming substrate 10 and the driving circuit substrate 30 by the adhesive layer 140 is formed.

Incidentally, as illustrated in FIG. 6, the adhesive layer 140 is disposed between the piezoelectric layers 70 of the piezoelectric element for inspection 152 disposed in the inspection region 200 and the driving circuit substrate 30. However, if the adhesive layer 140 is disposed over the entire front surface of the piezoelectric layer 70 of the piezoelectric element for inspection 152, the bump electrode 38 of the driving circuit substrate 30 cannot be abutted on the piezoelectric layer 70 of the piezoelectric element for inspection 152, and pressure to be applied to the core portions 371 and 381 of the bump electrodes 37 and 38 is decreased. Accordingly, in a case where the piezoelectric layer 70 of the piezoelectric element for inspection 152 and the driving circuit substrate 30 are bonded to each other by the adhesive layer 140, the adhesive layer 140 is preferably disposed only on a portion of a region of the front surface of the piezoelectric layer 70 of the piezoelectric element for inspection 152.

In the recording head 1 according to the embodiment, the piezoelectric element 150 is accommodated in the holding portion 160, and the driving circuit 120 is disposed at the second main surface 302 side of the driving circuit substrate 30. The driving circuit 120 has, so-called, a face-up arrangement facing the side opposite to the piezoelectric element 150. These piezoelectric elements 150 and the driving circuit 120 are electrically connected to each other by the first through wirings 33 and the second through wirings 34 that pass through the driving circuit substrate 30 and extend in the third direction Z. Therefore, to lead out the wirings that connects the driving circuit 120 mounted on the first main surface 301 of the driving circuit substrate 30 and the piezoelectric element 150 disposed at the second main surface 302 side of the driving circuit substrate 30, by suppressing the enlargement of the driving circuit substrate 30 and the flow path forming substrate 10, the recording head 1 can be downsized.

In the embodiment, it is not allowed to dispose the second electrode 80 in the piezoelectric element for inspection 152 disposed in the inspection region 200. Therefore, before bonding the driving circuit substrate 30 to the flow path forming substrate 10, an optical inspection for the piezoelectric layer 70 of the piezoelectric element for inspection 152 can be performed. Incidentally, a size of the piezoelectric element for inspection 152 is determined by a surface area of the required piezoelectric layer 70 according to a method of measuring the characteristics of the piezoelectric layer 70 or a measuring device used for measurement. For example, in a case where the piezoelectric layer 70 of the piezoelectric element for inspection 152 is measured by a X-ray diffraction (XRD), since the X-ray is obliquely incident on the front surface of the inspection region 200, if the incident light is circular, a measurement area is an elliptical shape. Accordingly, as the piezoelectric element for inspection 152, the surface area to which the piezoelectric layer 70 of a certain level or more is exposed is required. For example, in a case where a spot diameter of an emitting beam is 10 μm or more, the front surface of the piezoelectric layer 70 required in the piezoelectric element for inspection 152 is preferable to be 1 mm×1 mm or more. Incidentally, even if a region where the second electrode 80 is not disposed is present in the active portion 151 and the vicinity thereof, the exposed surface area of the piezoelectric layer 70 is narrow, and it is difficult to measure the characteristics of the piezoelectric layer 70. That is, if a region where the second electrode 80 is not disposed is widely disposed in the active portion 151 and the vicinity thereof, since the recording head 1 is enlarged, it is required to suppress to a minimum. In the embodiment, the piezoelectric element for inspection 152 can be dispose with a relatively large area at one edge side (+X side) of the active portion 151 in the parallel direction. Since the inspection region 200 where the piezoelectric element for inspection 152 of the flow path forming substrate 10 is disposed, as described above, is the dead space formed between the flow path forming substrate 10 and the driving circuit substrate 30 on the extended portion to dispose the flexible substrate mounting region 310 to which the flexible substrate 125 of the driving circuit substrate 30 is connected, the piezoelectric element for inspection 152 can be disposed with a required size for the optical inspection using a light beam in the inspection region 200. Accordingly, physical properties of the piezoelectric layer 70 can be surely measured and inspected in the optical inspection of the piezoelectric element for inspection 152.

As an inspection method for the piezoelectric layer 70 of the piezoelectric element for inspection 152, for example, a method using X-ray, such as an X-ray diffractometry method (XRD), a fluorescent X-ray diffraction method (XRF), and a X-ray reflectometry method (XRR), or an optical method using a light beam such as an ellipsometric film thickness measuring method is included. Even before the driving circuit substrate 30 is bonded to the flow path forming substrate 10, by abutting the electrode on the piezoelectric layer 70 of the piezoelectric element for inspection 152, the electrical characteristics of the piezoelectric layer 70 of the piezoelectric element for inspection 152 can be measured. As a measurement of the electrical characteristics of the piezoelectric layer 70 of the piezoelectric element for inspection 152, as described above, the hysteresis characteristics, the current—voltage characteristics (I-V characteristic), the current—time characteristic (I-t characteristics) and the capacity—voltage characteristics (C-V characteristic) are included.

As illustrated in FIGS. 1 to 3, a case member 40 forming the manifold 100 communicates with a plurality of the pressure chamber 12 is fixed to an assembly of the flow path forming substrate 10, the driving circuit substrate 30, the communicating plate 15 and the nozzle plate 20. The case member 40 has a substantially same shape as the communicating plate 15 described above in plan view. The case member 40 is bonded to the driving circuit substrate 30, and bonded to the communicating plate 15 described above. Specifically, the case member 40 has the recessed portion 41 having a depth the flow path forming substrate 10 and the driving circuit substrate 30 are accommodated at the driving circuit substrate 30 side. The recessed portion 41 has a wider opening area than a surface bonded to the flow path forming substrate 10 of the driving circuit substrate 30. In a state where the flow path forming substrate 10 is accommodated in the recessed portion 41, an opening surface of the nozzle plate 20 side of the recessed portion 41 is sealed by the communicating plate 15. A third manifold portion 42 having a recessed shape on both sides in the second direction Y of the recessed portion 41 is formed in the case member 40. The manifold 100 of the embodiment is configured of the first manifold portion 17 and the second manifold portion 18 disposed in the third manifold portion 42 and the communicating plate 15.

As a material of the case member 40, for example, a resin or metal can be used. Incidentally, the case member 40 can be mass-produced at low cost by molding a resin material.

The compliance substrate 45 is disposed on a surface at the nozzle plate 20 side of the communicating plate 15. The compliance substrate 45 seals an opening of the nozzle plate 20 sides of the first manifold portion 17 and the second manifold portion 18. This compliance substrate 45, in the embodiment, is provided with a sealing film 46 and a fixed substrate 47. The sealing film 46 is formed of a thin film having a flexibility (for example, thin film having thickness formed by polyphenylene sulfide (PPS) or stainless steel (SUS) is 20 µm or less), and the fixed substrate 47 is formed of a hard material of the metal such as stainless steel (SUS). Since a region facing the manifold 100 of the fixed substrate 47 is an opening portion 48 which is completely removed in the thickness direction, one side of the manifold 100 is a compliance portion 49 sealed only by the sealing film 46 having a flexibility.

An introduction path 44 to supply the ink to each of the manifolds 100 by communicating with the manifold 100 is disposed in the case member 40. A connection port 43 to which the driving circuit substrate 30 exposes and in which the flexible substrate 125 is inserted is disposed in the case member 40, and the flexible substrate 125 inserted into the connection port 43 is connected to the supply wirings 32 of the driving circuit substrate.

In the recording head 1 configured in this manner, when ejecting the ink, the ink is absorbed via the introduction path 44 from a liquid storage unit in which the ink is stored, and an internal flow path is filled with the ink from the manifold 100 up to the nozzle 21. Thereafter, the voltage is applied to each of the piezoelectric elements 150 corresponding to the pressure chamber 12 in accordance with the signal from the driving circuit 120. Therefore, the piezoelectric element 150 and the diaphragm 50 are subjected to be flexure deformation. Thereby, the pressure in the pressure chamber 12 increases and an ink droplet is ejected from the predetermined nozzle 21.

Here, a manufacturing method of the recording head 1 of the embodiment will be described with reference FIGS. 8 to 16. FIGS. 8 to 16 are cross-sectional views of the first direction X illustrating the manufacturing method of the recording head of the embodiment.

Figure 8:
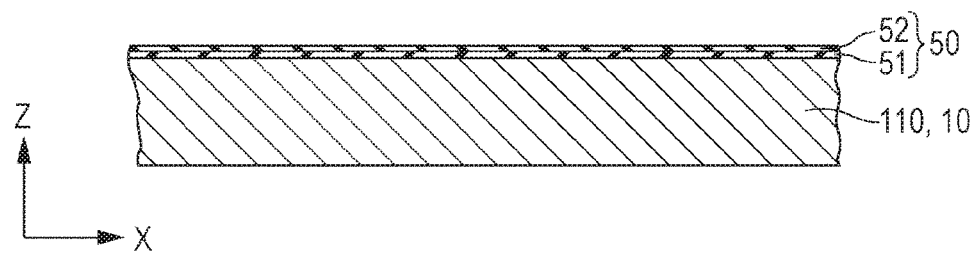
FIG. 8 is a cross-sectional view illustrating a manufacturing method of the recording head according to the first embodiment.

First, as illustrated in FIG. 8, the diaphragm 50 is formed on the front surface of a wafer for the flow path forming substrate 110 which is a silicon wafer and in which a plurality of the flow path forming substrate 10 are integrally formed. In the embodiment, the diaphragm 50 formed of stacking a silicon dioxide (elastic film 51) formed by thermal oxidation of the wafer for the flow path forming substrate 110, and a zirconium oxide (insulator film 52) formed by thermal oxidation after film formation by a sputtering method, is formed.

Figure 9:
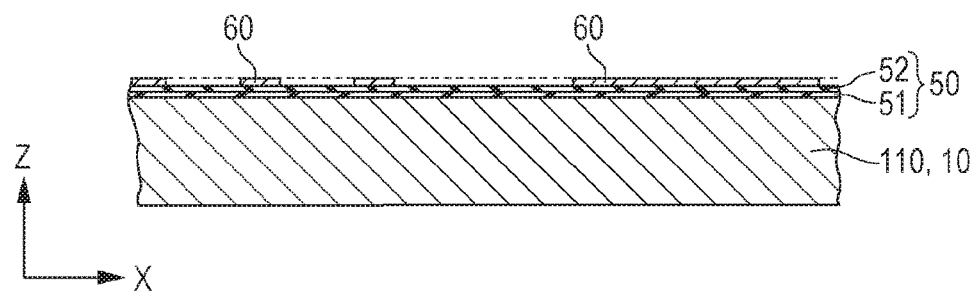
FIG. 9 is a cross-sectional view illustrating a manufacturing method of the recording head according to the first embodiment.

Next, as illustrated in FIG. 9, the first electrode 60 is formed and patterned in a predetermined shape on the entire surface of the diaphragm 50. A control layer to control crystal growth of the piezoelectric layer 70 may be formed on the first electrode 60. In the embodiment, although not specifically illustrated, titanium is used as a crystal control of the piezoelectric layer 70 (PZT). Since the titanium is incorporated into the piezoelectric layer 70 at the time of film formation of the piezoelectric layer 70, the titanium does not present as the film after the formation of the piezoelectric layer 70. In the embodiment, the first electrode 60 configuring each of the active portions 151 illustrated in FIG. 6, and the first electrode 60 configuring the piezoelectric element for inspection 152 are formed.

Figure 10:
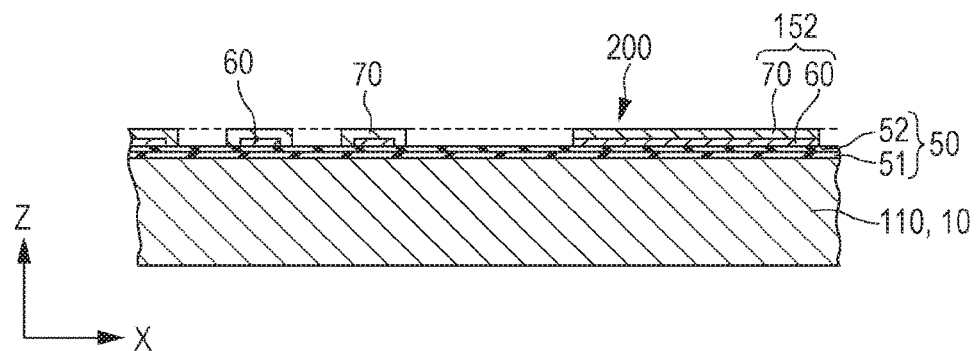
FIG. 10 is a cross-sectional view illustrating a manufacturing method of the recording head according to the first embodiment.

Next, as illustrated in FIG. 10, the piezoelectric layer 70 is formed and patterned in a predetermined shape on the first electrode 60. Here, in the embodiment, by coating and drying so-called sol obtained by dissolving and dispersing a metal complex in a solvent to be gelled, and further firing at a high temperature, the piezoelectric layer 70 formed of a metal oxide is obtained, that is, the piezoelectric layer 70 is formed using so-called a sol-gel method. As a manufacturing method of the piezoelectric layer 70, without being limited to the sol-gel method, for example, a metal-organic decomposition (MOD) method, a sputtering method, or a physical vapor deposition (PVD) method such as a laser ablation method may be used. That is, the piezoelectric layer 70 may be formed by any of a liquid phase method and a vapor phase method. As a patterning of the piezoelectric layer 70, for example, reactive ion etching, dry etching such as ion milling, or wet etching is included. In the patterning of the piezoelectric layer 70, the recessed portion 71 is formed on the piezoelectric layer 70, and the piezoelectric layer 70 is left at a portion to be the piezoelectric element for inspection 152.

Figure 11:
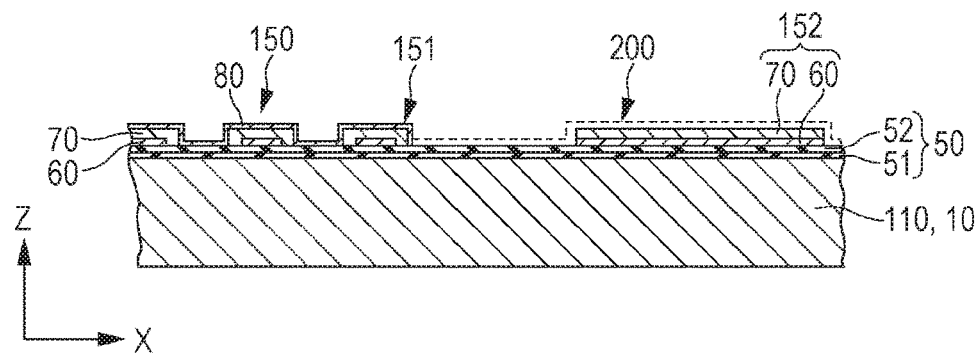
FIG. 11 is a cross-sectional view illustrating a manufacturing method of the recording head according to the first embodiment.

Next, as illustrated in FIG. 11, the second electrode 80 is formed and patterned in a predetermined shape over the upper portion of the piezoelectric layer 70 and the diaphragm 50 patterned. That is, after forming the second electrode 80 on the piezoelectric layer 70 of the piezoelectric element for inspection 152, the second electrode 80 on the piezoelectric layer 70 of the piezoelectric element for inspection 152 is removed. In the embodiment, although the second electrode 80 is formed after patterning the piezoelectric layer 70, it is not specifically limited thereto. For example, in a case where the second electrode 80 is stacked with a first layer disposed on the piezoelectric layer 70 side, and a second layer disposed on a side opposite to the piezoelectric layer 70 of the first layer, after forming the first layer on the piezoelectric layer 70 before pattering the piezoelectric layer 70, a reheating treatment (post annealing) is performed on the piezoelectric layer 70. Therefore, damage when forming the first layer on the piezoelectric layer 70 is allowed to be recovered, and piezoelectric characteristics of the piezoelectric layer 70 can be improved. After forming the first layer and performing the reheating treatment on the piezoelectric layer 70, the piezoelectric layer 70 and the first layer are patterned, and thereafter, the second layer may be formed on the first layer. As a matter of course, after forming the second electrode 80 of the first layer and the second layer, the second electrode 80 may be reheated.

The physical properties of the piezoelectric layer 70 are optically inspected (optical inspection process) for the piezoelectric layer 70 of the piezoelectric element for inspection 152 formed in this manner. That is, since the second electrode 80 is formed on the active portion 151 formed by the patterning of the second electrode 80, the physical properties of the piezoelectric layer 70 cannot be optically inspected. Since a portion to which the front surface of the piezoelectric layer 70 is sufficiently exposed on the active portion 151 and the vicinity thereof is absent, the measurement of the piezoelectric layer 70 cannot be performed. In the embodiment, since the front surface of the piezoelectric layer 70 can be sufficiently exposed to the piezoelectric element for inspection 152, the optical inspection of the piezoelectric layer 70 can be easily performed. As the optical inspection of the piezoelectric layer 70, for example, a method using X-ray, such as the X-ray diffractometry method (XRD), the fluorescent X-ray diffraction method (XRF), and the X-ray reflectometry method (XRR), or the ellipsometric film thickness measuring method is included. Incidentally, although configuration is also conceivable to dispose the piezoelectric element for inspection 152 in addition to a region which is a chip (flow path forming substrate 10) illustrated in FIG. 1 of the wafer for the flow path forming substrate 110, without the piezoelectric element for inspection 152 is formed for each chip, quality management of a chip unit cannot be performed with high precision. Since the manufacturing variations on the physical properties of the piezoelectric layer 70 occur in the in-plane direction of the wafer for the flow path forming substrate 110, if a distance between a region which is the flow path forming substrate 10 and the inspection region 200 in which the piezoelectric element for inspection 152 is disposed is separated, an error between the physical properties of the piezoelectric layer 70 on the flow path forming substrate 10 and the physical properties of the piezoelectric layer 70 of the piezoelectric element for inspection 152 of the inspection region 200 occurs, and thus the piezoelectric layer 70 cannot be evaluated with high precision. For example, in addition to one chip of the flow path forming substrate 10 described above, if the inspection region 200 is disposed newly to further dispose the piezoelectric element for inspection 152, the number capable of forming simultaneously the flow path forming substrate 10 from one piece of the wafer for the flow path forming substrate 110, so-called, the number of taking is reduced. In the embodiment, as described above, since the inspection region 200 disposing the piezoelectric element for inspection 152 is disposed on the dead space of the flow path forming substrate 10 where the flexible substrate 125 is extended to be connected, the piezoelectric element for inspection 152 to measure the piezoelectric layer 70 for each chip (flow path forming substrate 10) can be disposed. By disposing the piezoelectric element for inspection 152 for each chip, the piezoelectric layer 70 of the piezoelectric element 150 of the active portion 151 and the piezoelectric layer 70 of the piezoelectric element for inspection 152 can be disposed in proximity to each other, and the error between the physical properties of the piezoelectric layer 70 of the piezoelectric element for inspection 152 and the characteristics of the piezoelectric layer 70 of the piezoelectric element 150 having the active portion 151 is reduced. Therefore, by measuring the physical properties of the piezoelectric layer 70 of the piezoelectric element for inspection 152, the piezoelectric layer 70 of the piezoelectric element 150 having the active portion 151 can be evaluated with high precision. Furthermore, by disposing the piezoelectric element for inspection 152 on the dead space, the enlargement of the flow path forming substrate 10 can be suppressed. Therefore, it is suppressed that the number of taking of the flow path forming substrate 10 from one piece of the wafer for the flow path forming substrate 110 is reduced, and thus the cost can be reduced.

Incidentally, although a method measuring the characteristics of the exposed piezoelectric layer 70 is conceivable in the previous process of forming the second electrode 80 illustrated in FIG. 10, without disposing the piezoelectric element for inspection 152, since a process of patterning the piezoelectric layer 70 or a process of film-forming and patterning the second electrode 80 is required to form the active portion 151, and the characteristics of the piezoelectric layer 70 is changed by a subsequent process in this manner, the error between the physical properties of the actually completed piezoelectric layer 70 of the piezoelectric element 150 and the measurement result occurs. In the embodiment, after a process of forming the piezoelectric element 150, that is, after a process of forming the second electrode 80, to measure the physical properties of the piezoelectric layer 70 of the piezoelectric element for inspection 152, the physical properties of the piezoelectric layer 70 of the piezoelectric element for inspection 152 through the same process as the piezoelectric layer 70 of the piezoelectric element 150 having the active portion 151 can be measured. Accordingly, by measuring the physical properties of the piezoelectric layer 70 of the piezoelectric element for inspection 152, the piezoelectric layer 70 of the piezoelectric element 150 having the active portion 151 can be evaluated with high precision. As a matter of course, both of the measurement of the physical properties of the piezoelectric layer 70 before forming the second electrode 80 illustrated in FIG. 10, and the measurement of the physical properties of the piezoelectric layer 70 of the piezoelectric element for inspection 152 after forming the second electrode 80 illustrated in FIG. 11 may be performed.

Since determination of a defective product can be performed by measuring the physical properties of the piezoelectric layer 70 before forming the pressure chamber 12 by the anisotropic etching, it is not required to perform the subsequent process for the defective product, and thus the cost can be reduced. By measuring the physical properties of the piezoelectric layer 70, the process that adversely affects on the physical properties of the piezoelectric layer 70 is easily identified, and trouble of the manufacturing process can be avoided.

Figure 12:
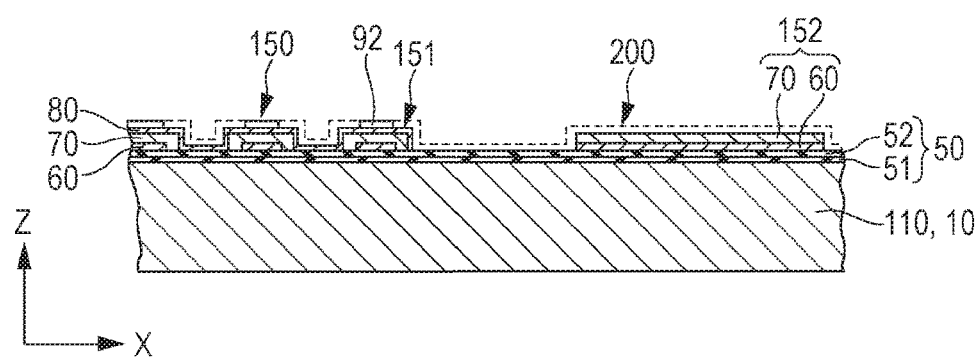
FIG. 12 is a cross-sectional view illustrating a manufacturing method of the recording head according to the first embodiment.
Figure 13:
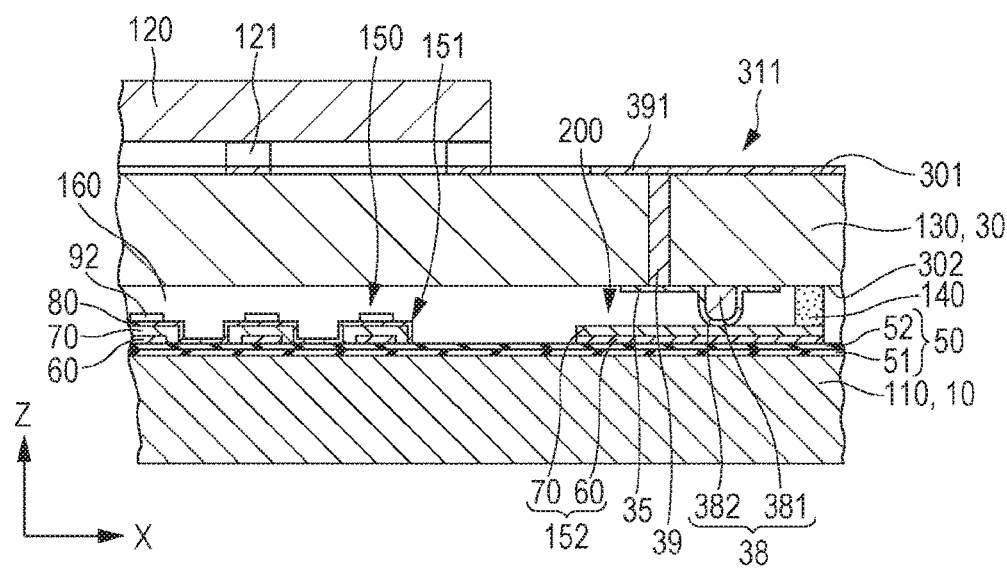
FIG. 13 is a cross-sectional view illustrating a manufacturing method of the recording head according to the first embodiment.

Next, as illustrated in FIG. 12, the individual lead electrode 91 formed of gold (Au) and the common lead electrode 92 are formed and patterned in the predetermined shape. The optical inspection of the piezoelectric layer 70 of the piezoelectric element for inspection 152 may be performed after film-forming and pattering the individual lead electrode 91 and the common lead electrode 92.

after forming the individual lead electrode 91 and the common lead electrode 92 in this manner, as illustrated in FIG. 13, a wafer for the driving circuit substrate 130 on which the first individual wirings 31, the supply wirings 32, the first through wirings 33, the second through wirings 34, the second individual wirings 35, the connection wirings 36, the bump electrode 37 and 38, the third through wirings 39, and the inspection electrode 391 is previously formed is bonded to the piezoelectric element 150 side of the wafer for the flow path forming substrate 110 via the adhesive layer 140. Thereby, the individual lead electrode 91 and the common lead electrode 92 are connected to the second individual wirings 35 and the connection wirings 36 via the bump electrode 37. The bump electrode 38 is abutted on the inspection region 200 of the piezoelectric layer 70.

Figure 14:
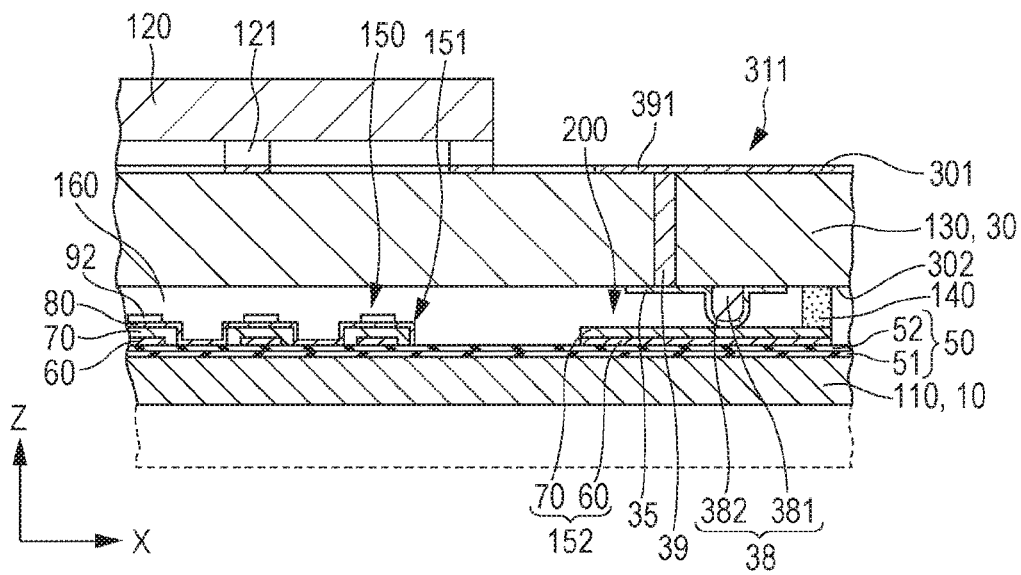
FIG. 14 is a cross-sectional view illustrating a manufacturing method of the recording head according to the first embodiment.

Next, as illustrated in FIG. 14, the wafer for the flow path forming substrate 110 to which the wafer for the driving circuit substrate 130 is bonded is thinned to a predetermined thickness.

Next, as illustrated in FIG. 14, a mask film 53 is newly formed and patterned in a predetermined shape on the wafer for the flow path forming substrate 110.

Figure 15:
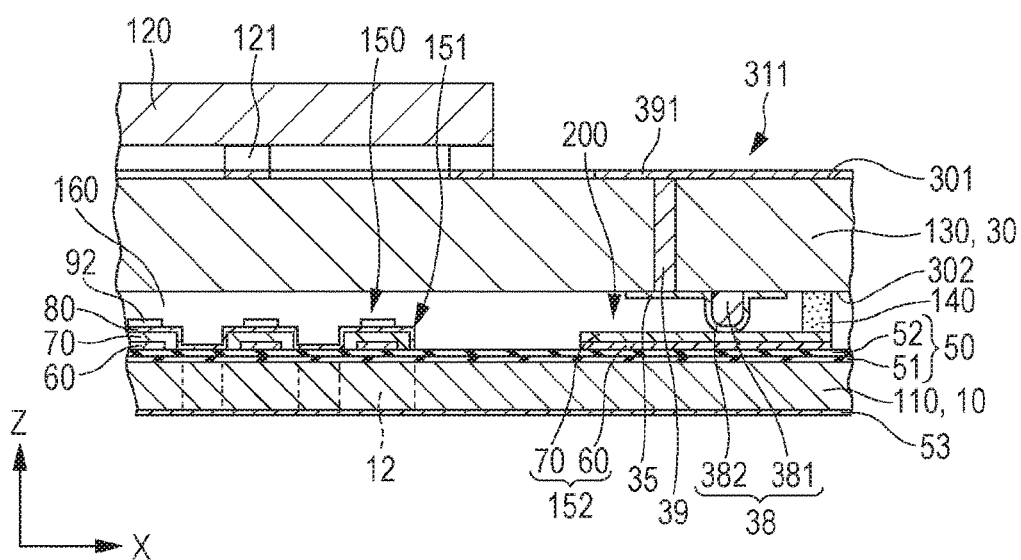
FIG. 15 is a cross-sectional view illustrating a manufacturing method of the recording head according to the first embodiment.
Figure 16:
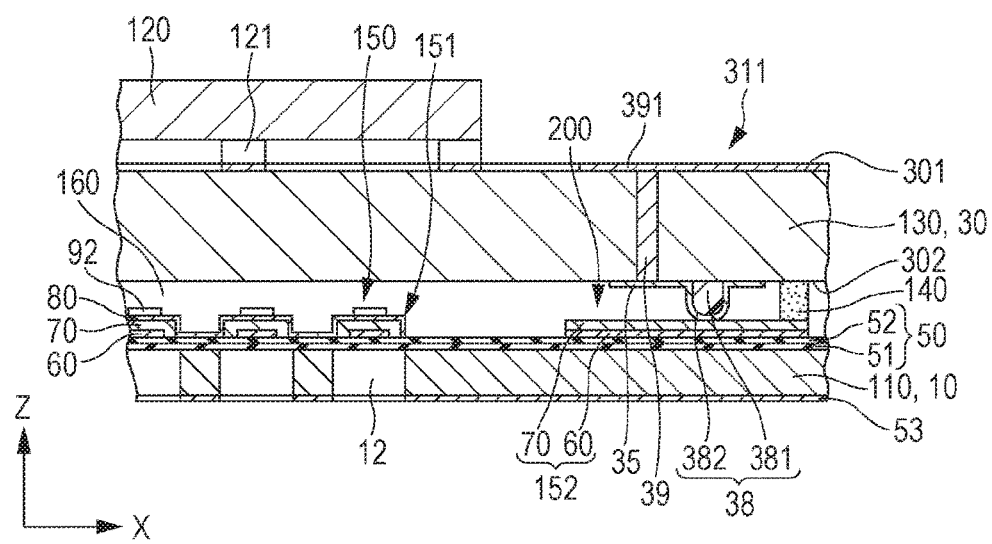
FIG. 16 is a cross-sectional view illustrating a manufacturing method of the recording head according to the first embodiment.

Next, as illustrated in FIG. 15, by performing the anisotropic etching (wet etching) of the wafer for the flow path forming substrate 110 using an alkaline aqueous solution via the mask film 53, the pressure chamber 12 corresponding to the piezoelectric element 150 is formed.

Thereafter, after dividing the assembly to which the wafer for the flow path forming substrate 110 and the wafer for the driving circuit substrate 130 are bonded, so as to be the flow path forming substrate 10 and the driving circuit substrate 30 of one chip size, as illustrated in FIG. 1, the communicating plate 15 in which the nozzle communicating path 16 is formed, the nozzle plate 20 in which the nozzle 21 is formed, and the compliance substrate 45 are bonded to a surface on a side opposite to the driving circuit substrate 30 of the flow path forming substrate 10 in order, as illustrated in FIG. 3. The recording head 1 of the embodiment is formed by bonding the case member 40 to the driving circuit substrate 30 and the communicating plate 15.

In the recording head 1 formed in this manner, since the inspection region 200 where the piezoelectric element for inspection 152 is disposed is covered by the driving circuit substrate 30, the electrical characteristics of the piezoelectric element for inspection 152 cannot be inspected after the recording head 1 is assembled. However, in the embodiment, since the bump electrode 38 is abutted on the piezoelectric layer 70 of the piezoelectric element for inspection 152, and the bump electrode 38 is led out to the first main surface 301 side of the driving circuit substrate 30 via the third through wirings 39 and is connected to the inspection electrode 391, without disassembling the bonding state between the flow path forming substrate 10 and the driving circuit substrate 30, the electrical characteristics of the piezoelectric layer 70 of the piezoelectric element for inspection 152 can be measured and inspected via the inspection electrode 391. Accordingly, the electrical characteristics of the piezoelectric element 150 are understood, the quality management can be performed with high precision, and driving suitable for the actual electrical characteristics of the piezoelectric element 150 can be performed. That is, in the piezoelectric element for inspection 152, by measuring the electrical characteristics, the damage on the piezoelectric layer 70 due to hydrogen generated in forming the pressure chamber 12 on the wafer for the flow path forming substrate 110 is understood, and thus the piezoelectric layer 70 can be evaluated.

Thus, according to the manufacturing method of the recording head 1 according to the embodiment, the flow path forming substrate 10 and the driving circuit substrate 30 is downsized, and the recording head 1 can be downsized. Since the recording head 1 can be downsized, it can also correspond to the high density of the nozzle 21. Therefore, the recording head 1 capable of discharging ink in high density can be manufactured.

Another Embodiment

Hereinbefore, although an embodiment of the invention is described, the basic configuration of the invention is not limited to the embodiment described above.

For example, in the first embodiment described above, although the bump electrode 38 is abutted on the piezoelectric layer 70 of the piezoelectric element for inspection 152 disposed in the inspection region 200 as the electrode, and the bump electrode 38 is led out to the first main surface 301 by the third through wirings 39 and is connected to the inspection electrode 391, without being specifically limited thereto, for example, the electrode may not be abutted on the front surface of the piezoelectric layer 70 of the piezoelectric element for inspection 152. That is, for example, as the piezoelectric element for inspection 152, the second electrode 80 may be disposed on the piezoelectric layer 70. In this case, the second electrode 80 may be electrically connected to the inspection electrode 391. In the inspection region 200, both of the piezoelectric element for inspection 152 which does not dispose the same second electrode 80 as the first embodiment described above, and the piezoelectric element for inspection disposed the second electrode 80 may be disposed. Thereby, both of the optical inspection in the middle of the manufacturing, and the measurement of the electrical characteristics of the piezoelectric element for inspection after the manufacturing can be performed.

Furthermore, in the first embodiment described above, although the piezoelectric element for inspection 152 is disposed using the dead space extended to connect the flexible substrate 125 between the flow path forming substrate 10 and the driving circuit substrate 30 as the inspection region 200, without being specifically limited thereto, for example, another measurement pattern different from the piezoelectric element for inspection 152 of the first embodiment may be formed on the dead space. The piezoelectric element for inspection 152 may be disposed at both sides of the first direction X of the flow path forming substrate 10. However, by disposing the piezoelectric element for inspection 152 also on the edge on a side opposite to the edge in which the flexible substrate 125 is connected, the first direction X of the flow path forming substrate 10 and the driving circuit substrate 30 is enlarged, in comparison with the first embodiment.

Furthermore, in the first embodiment described above, although the bump electrodes 37 and 38 are disposed on the second main surface 302 of the driving circuit substrate 30, without being specifically limited thereto, the bump electrode may be disposed at the flow path forming substrate 10 side. The positions of the bump electrodes 37 and 38 are not limited to the first embodiment described above.

In the first embodiment, although one driving circuit 120 is disposed for two rows of the piezoelectric element 150, it is not specifically limited thereto. For example, the driving circuit 120 may be disposed for each row of a first row of piezoelectric element 150, and a plurality of the driving circuits 120 divided into two or more in the first direction X may be disposed for the row of the first row of the piezoelectric element 150.

Furthermore, in the first embodiment, although the bump electrode 37 connecting the connection wirings 36 to the common lead electrode 92 is disposed so that two connection wirings 36 partially cover the front surface of one core portion 371, without being specifically limited thereto, for example, the core portion 371 may be disposed for each of the connection wirings 36. The core portion 371 of the bump electrode 37 for the connection wirings 36 and the core portion 371 of the bump electrode 37 for the second individual wirings 35 may be made common.

In the first embodiment described above, although it is described using the piezoelectric element 150 of thin film type, as the piezoelectric element that causes a pressure change in the pressure chamber 12, without being specifically limited thereto, for example, the piezoelectric element of thick film type formed by a method of attaching a green sheet, or the piezoelectric element of longitudinal vibration type expanding and contracting in the axial direction by stacking alternately a piezoelectric material and an electrode forming material can be used.

Furthermore, in the first embodiment described above, although the recording head 1 is downsized by leading out each of the wirings of the second main surface 302 to the first main surface 301 via the first through wirings 33, the second through wirings 34, and the third through wirings 39, the wirings leading out each of the wirings of the second main surface 302 to the first main surface 301 side are not limited to the first through wirings 33, the second through wirings 34, and the third through wirings 39. As a matter of course, the driving circuit 120 may be disposed on the second main surface 302.

Furthermore, the head unit may be configured using a plurality of recording heads 1 of the first embodiment described above. In this case, all of the recording head configuring the head unit may be the recording head 1 having the inspection region 200 where the piezoelectric element for inspection 152 described above is disposed, and at least one of a plurality of the recording head configuring the head unit may be the recording head 1 having the inspection region 200 where the piezoelectric element for inspection 152 described above is disposed.

The completed recording head 1 of the first embodiment is mounted on an ink jet recording apparatus which is one example of a liquid ejecting apparatus. FIG. 17 is a schematic view illustrating an example of the ink jet recording apparatus.

As illustrated, in the ink jet recording apparatus I, the recording head 1 in which a cartridge 2 configuring an ink supply unit is detachably disposed, and a carriage 3 on which the recording head 1 is mounted is disposed axially movably to a carriage shaft 5 attached to an apparatus main body 4.

Driving force of a driving motor 6 is transmitted to the carriage 3 via a plurality of gears and a timing belt 7 (not illustrated). Therefore, the carriage 3 on which the recording head 1 is mounted is moved along the carriage shaft 5. On the other hand, the apparatus main body 4 is disposed with a transport roller 8 as a transportation unit, and a recording sheet S which is a recording medium such as a sheet is adapted to be transported by the transport roller 8. The transportation unit transporting the recording sheet S may be a belt or a drum, without being limited to the transport roller.

In the ink jet recording apparatus I described above, although an apparatus in which the recording head 1 is mounted on the carriage 3 and is moved in the main scanning direction is exemplified, without being specifically limited thereto, for example, the invention can also be applied to, so-called, a recording apparatus of line type in which the recording head 1 is fixed, and the printing is performed only by moving the recording sheet S such as the sheet in the sub scanning direction.

In the example described above, although the ink jet recording apparatus I has a configuration in which the cartridge 2 which is the liquid storage unit is mounted on the carriage 3, without being specifically limited thereto, for example, the liquid storage unit such as a ink tank is fixed to the apparatus main body 4, and a storage unit and the recording head 1 may be connected via a supply tube such as tube. The liquid storage unit may not be mounted on the ink jet recording apparatus.

Furthermore, the invention has a wide target for a general head, for example, and can be applied to the recording head such as various kinds of the ink jet recording head used in an image recording apparatus of a printer, a coloring material ejecting head used for manufacturing color filters for a liquid crystal display, an electrode material ejecting head used for forming the electrode such as an organic EL display or a field emission display (FED), and a bioorganic material ejecting head used for manufacturing biochips.

The invention has a wide target for a piezoelectric device, and can be applied to the piezoelectric device in addition to the recording head. As the piezoelectric device, a device detecting the signal from the outside and changing a current value before and after the detection is included. As an example of this piezoelectric device, an ultrasonic device, a motor, a pressure sensor, a pyroelectric element, and a ferroelectric element are included. The assemblies using these piezoelectric devices, for example, the liquid ejecting apparatus using the above head, the ultrasonic sensor using the above ultrasonic device, a robot using the above motor as a driving source, an IR sensor using the above pyroelectric element, and a ferroelectric memory using a ferroelectric element are included in the piezoelectric device.

What is claimed is:
1. An inspection method for a piezoelectric device, the piezoelectric device including:
    a device substrate that includes a plurality of active piezoelectric elements and an inspection piezoelectric element, each of the plurality of active piezoelectric elements including:
        an active first electrode that is on the device substrate;
        an active piezoelectric layer that is directly on the active first electrode; and
        an active second electrode that is directly on the active piezoelectric layer;

the inspection piezoelectric element being located at an inspection region, the inspection piezoelectric element being configured with:
- an inspection first electrode that is on the device substrate; and
- an inspection piezoelectric layer that is directly on the inspection first electrode, wherein an inspection second electrode is removable from the inspection piezoelectric element; and a wiring substrate that is disposed over the device substrate via a gap so that the plurality of active piezoelectric elements and the inspection piezoelectric element are provided in the gap, the wiring substrate has an inspection wiring electrode that is electrically connected to the inspection piezoelectric layer, the method comprising:
- providing the device substrate having the plurality of active piezoelectric elements and the inspection piezoelectric element having the inspection second electrode;
- removing the inspection second electrode from the inspection piezoelectric element;
- optically inspecting physical properties of the inspection piezoelectric layer; and
- electrically connecting the inspection wiring electrode of the wiring substrate to the inspection piezoelectric layer.

2. The inspection method for a piezoelectric device according to claim 1, further comprising:
- disposing a common second electrode layer on the active piezoelectric layers and the inspection piezoelectric layer during the providing of the device substrate; and
- selectively removing the common second electrode layer so that the active second electrodes are formed on the active piezoelectric layers and the inspection second electrode is removed from a too surface of the inspection piezoelectric layer during the removing the inspection second electrode,
- wherein after the selectively removing of the common second electrode layer, the optically inspecting of physical properties of the inspection piezoelectric layer is performed.

3. The inspection method for a piezoelectric device according to claim 1,
- wherein when the optically inspecting of physical properties of the inspection piezoelectric layer is performed, light beams used are applied to the inspection region, and
- the inspection region is an area where the inspection piezoelectric layer exists.

4. The inspection method for a piezoelectric device according to claim 1, further comprising:
- bonding the wiring substrate to the device substrate after the active second electrodes are formed;
- electrically connecting the inspection piezoelectric layer to the inspection wiring electrode formed on the wiring substrate via a through wiring formed in the wiring substrate; and
- measuring electrical characteristics of the inspection piezoelectric layer.

5. The inspection method for a piezoelectric device according to claim 4,
- wherein a flexible substrate is connected to a top surface of the wiring substrate,
- wherein the inspection wiring electrode is connected to a terminal to which the wiring substrate and the flexible substrate are connected, and
- wherein the electrical characteristics of the plurality of active piezoelectric layers are measured via the flexible substrate.

* * * * *